United States Patent
Shim et al.

(10) Patent No.: US 7,034,719 B2
(45) Date of Patent: Apr. 25, 2006

(54) DATA MODULATING METHOD AND APPARATUS, DATA DEMODULATING METHOD AND APPARATUS, AND CODE ARRANGING METHOD

(75) Inventors: Jae-seong Shim, Seoul (KR); Jin-han Kim, Gyeonggi-do (KR); Kiu-hae Jung, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/667,670

(22) Filed: Sep. 23, 2003

(65) Prior Publication Data

US 2004/0061631 A1  Apr. 1, 2004

(30) Foreign Application Priority Data

Sep. 27, 2002  (KR) .................. 10-2002-0058809
Oct. 17, 2002  (KR) .................. 2002-63534

(51) Int. Cl.
 *H03M 5/00* (2006.01)
 *H03M 7/00* (2006.01)
 *H03M 7/20* (2006.01)

(52) U.S. Cl. ................ 341/58; 341/59; 341/102
(58) Field of Classification Search ........ 341/58, 341/59, 102, 103; 375/240; 714/769, 806
 See application file for complete search history.

(56) References Cited

U.S. PATENT DOCUMENTS

| | | | | |
|---|---|---|---|---|
| 5,742,243 A | * | 4/1998 | Moriyama ............... | 341/59 |
| 6,002,718 A | * | 12/1999 | Roth ..................... | 375/240 |
| 6,177,890 B1 | * | 1/2001 | Keirn et al. ............. | 341/59 |
| 6,225,921 B1 | * | 5/2001 | Kahlman et al. ......... | 341/58 |
| 6,281,815 B1 | * | 8/2001 | Shim et al. .............. | 341/59 |
| 6,324,138 B1 | | 11/2001 | Hori et al | |
| 6,441,756 B1 | * | 8/2002 | Shim ...................... | 341/59 |
| 6,604,219 B1 | * | 8/2003 | Lee et al. ................ | 714/769 |

FOREIGN PATENT DOCUMENTS

| | | |
|---|---|---|
| EP | 0 343 930 A2 | 11/1989 |
| EP | 1 047 197 A2 | 10/2000 |

(Continued)

OTHER PUBLICATIONS

U.S. Appl. No. 10/791,268, Shim et al□□filed on Mar. 3, 2004□□Published on Oct. 14, 2004□□.*

(Continued)

*Primary Examiner*—Patrick Wamsley
(74) *Attorney, Agent, or Firm*—Stein, McEwen & Bui, LLP

(57) ABSTRACT

In a data demodulating method and apparatus, and a code arranging method, a multiplexer multiplexes an input data stream divided by a predetermined length into a plurality of types of pseudo random data streams using multiplexed information of predetermined bits by applying a predetermined multiplexing method to each of the pseudo random data streams. An encoder RLL-modulates the plurality of types of pseudo random data streams to create a modulated code stream including a minimum of DC components. The multiplexer generates the random data streams by inconsecutively scrambling the input data stream using the multiplexed information. The encoder weak DC-free RLL-modulates each of the multiplexed data streams without using a DC control sub code conversion table to which additional bits are added and provides a code stream including a minimum of DC components among multiplexed, RLL-modulated code streams.

23 Claims, 17 Drawing Sheets

FOREIGN PATENT DOCUMENTS

| | | |
|---|---|---|
| EP | 1 187 335 A2 | 3/2002 |
| EP | 1 251 641 A2 | 10/2002 |
| KR | 10-1999-7003183 | 4/1999 |
| KR | 10-294893 | 4/2001 |
| KR | 2002-19674 | 3/2002 |

OTHER PUBLICATIONS

Kees A. Schouhamer Immink; Codes for Mass Data Storage Systems; Chapter 13, 1999; pp. 261-278.

Kees A. Schouhamer Immink; Codes for Mass Data Storage Systems; Chapter 13, 1999; pp. 261-278, no month.

Search Report issued in European Patent Application No. 03256024.5 on Sep. 30, 2005.

Coene et al., "EFMCC: A New Combi-Code For High Density Optical Recording", *Proceedings Of The SPIE*, SPIE, Bellingham, VA, US, vol. 4090, 2000, pp. 275-282, no month.

Kunisa, "Runlength Control Based On Guided Scrambling For Digital Magnetic Recording", *IEICE Transactions On Electronics*, Institute Of Electronics Information And Comm. Eng. Tokyo, JP, vol. E82-C, No. 12, 1999, pp. 2209-2217, no month.

\* cited by examiner

FIG. 8

| | LZ (EZ) | Number | Supplement | Number | Elimination | Number | Total Number (Redundant) |
|---|---|---|---|---|---|---|---|
| MCG1 | $1 \leq LZ \leq 7$ $(0 \leq EZ \leq 5)$ | 210 | 1010xxxxxxx $(0 \leq EZ \leq 5)$ | 51 | | | 261(5) |
| MCG2 | $0 \leq LZ \leq 4$ $(0 \leq EZ \leq 5)$ | 316 | | | 1010xxxxxxx $(0 \leq EZ \leq 5)$ | 51 | 265(9) |
| MCG3 | $0 \leq LZ \leq 2$ $(0 \leq EZ \leq 5)$ | 264 | | | | | 264(8) |

FIG. 9

| | LZ (EZ) | Number | Supplement 1 | Number | Supplement 2 | Number | Supplement 3 /Elimination | Number | Total Number |
|---|---|---|---|---|---|---|---|---|---|
| ACG1 | $1 \leq LZ \leq 7$ ($6 \leq EZ \leq 7$) | 8 | | | Redundant Code Word from MCG1 | 5 | 1010xxxxxxx ($6 \leq EZ \leq 7$) | 2 | 15 |
| ACG2 | $0 \leq LZ \leq 6$ ($6 \leq EZ \leq 7$) | 12 | $5 \leq LZ \leq 6$ ($0 \leq EZ \leq 5$) | 21 | Redundant Code Word from MCG2 | 9 | 1010xxxxxxx ($6 \leq EZ \leq 7$) | -2 | 40 |
| ACG3 | $0 \leq LZ \leq 3$ ($6 \leq EZ \leq 7$) | 10 | $LZ=3$ ($0 \leq EZ \leq 5$) | 33 | Redundant Code Word from MCG3 | 8 | | | 51 |

| EZ_a | M=ncgdet (CODE WORD a) |
|---|---|
| 0 | 1 |
| 1-3 | 2 |
| 4-7 | 3 |

CODE WORD a     CODE WORD b

| CODE WORD a | CODE WORD b | CHANGE IN INV |
|---|---|---|
| xxxxxxx0101 → xxxxxxx0100 | 1010xxxxxxxx | CHANGED |
| xxxxxx01001 → xxxxxx01010 | | UNCHANGED |
| ~ | | |
| xxx100000001 → xxx100001010 | | |

| MULTIPLEXED INFORMATION | CONVERTED MULTIPLEXED ID | NEXT STATE |
|---|---|---|
| 0 | 100001 | 1 |
| 1 | 100010 | 2 |
| 2 | 100100 | 2 |
| 3 | 100101 | 1 |
| 4 | 101000 | 2 |
| 5 | 101001 | 1 |
| 6 | 000100 | 2 |
| 7 | 000101 | 1 |
| 8 | 001000 | 2 |
| 9 | 001001 | 1 |
| A | 001010 | 2 |
| B | 010000 | 3 |
| C | 010001 | 1 |
| D | 010010 | 2 |
| E | 010100 | 2 |
| F | 010101 | 1 |

FIG. 15A

| Data Symbol | MCG1 Code Word (MSB ... LSB) | NCG | MCG2 Code Word (MSB ... LSB) | NCG | MCG3 Code Word (MSB ... LSB) | NCG |
|---|---|---|---|---|---|---|
| 000 | 000001010000 | 3 | 000010010000 | 3 | 001000001001 | 1 |
| 001 | 000010010000 | 3 | 000010001001 | 1 | 001000001010 | 2 |
| 002 | 000000100000 | 3 | 000010001010 | 2 | 001000010010 | 2 |
| 003 | 000101010000 | 3 | 000010010010 | 2 | 001000010101 | 1 |
| 004 | 001001010000 | 3 | 000010010101 | 1 | 001000010100 | 2 |
| 005 | 001010010000 | 3 | 000010010100 | 2 | 001000101001 | 1 |
| 006 | 001010100000 | 3 | 000010000001 | 1 | 001000000010 | 2 |
| 007 | 000010100000 | 3 | 000010000010 | 2 | 001001010000 | 3 |
| 008 | 101001010000 | 3 | 000010100000 | 3 | 001001001001 | 1 |
| 009 | 101010010000 | 3 | 000010010001 | 1 | 001000000100 | 2 |
| 010 | 000100010000 | 3 | 000010100010 | 2 | 001000001000 | 2 |
| 011 | 000000101001 | 1 | 000010100100 | 2 | 001000000101 | 1 |
| 012 | 000000101010 | 2 | 000010100101 | 1 | 001010010000 | 3 |
| 013 | 000001001010 | 2 | 000010101000 | 2 | 001001010001 | 1 |
| 014 | 000001010101 | 1 | 000010101001 | 1 | 001000101010 | 2 |
| 015 | 010001010000 | 3 | 000010000100 | 2 | 001001001010 | 2 |
| 016 | 000000100001 | 1 | 000101010000 | 3 | 001001010101 | 1 |
| 017 | 000000100010 | 2 | 000100000001 | 1 | 001001010010 | 2 |
| 018 | 000000100100 | 2 | 000010001000 | 2 | 001000010001 | 1 |
| 019 | 000000100101 | 1 | 000010101010 | 2 | 001000100010 | 2 |
| 020 | 000001001001 | 1 | 000010000101 | 1 | 001010100000 | 3 |
| 021 | 000001010010 | 2 | 000100010000 | 3 | 001010001001 | 1 |
| 022 | 000001010100 | 2 | 001001010000 | 3 | 001001010100 | 2 |
| 023 | 000010010101 | 1 | 001010010000 | 3 | 001010001010 | 2 |
| 024 | 000010001010 | 2 | 001010100000 | 3 | 001010010101 | 1 |
| 025 | 000001000001 | 1 | 010001010000 | 3 | 001010010010 | 2 |
| 026 | 000000101000 | 2 | 010010010000 | 3 | 001000100001 | 1 |
| 027 | 010010010000 | 3 | 000100100000 | 3 | 001000100100 | 2 |
| 028 | 000010000001 | 1 | 010010100000 | 3 | 001000010000 | 3 |
| 029 | 000001000010 | 2 | 010100010000 | 3 | 001001000001 | 1 |
| 030 | 000001000100 | 2 | 001000010000 | 3 | 001000101000 | 2 |
| 031 | 000001000101 | 1 | 000100010101 | 1 | 001001000010 | 2 |
| 032 | 010010100000 | 3 | 000100001010 | 2 | 001000100101 | 1 |
| 033 | 000010101001 | 1 | 000100101001 | 1 | 010001010000 | 3 |
| 034 | 000001001000 | 2 | 000100000010 | 2 | 010010010000 | 3 |
| 035 | 000010000010 | 2 | 010100100000 | 3 | 010010100000 | 3 |
| 036 | 000010000101 | 1 | 000101001001 | 1 | 010100010000 | 3 |
| 037 | 000010000100 | 2 | 000100000100 | 2 | 001000100000 | 3 |
| 038 | 000001010001 | 1 | 000100001000 | 2 | 010100100000 | 3 |
| 039 | 000001010010 | 2 | 000100000101 | 1 | 100001010000 | 3 |
| 040 | 000010001001 | 1 | 000101010001 | 1 | 010000010000 | 3 |
| 041 | 000010010100 | 2 | 000100101010 | 2 | 010000100000 | 3 |
| 042 | 000010100010 | 2 | 000101001010 | 2 | 010101010000 | 3 |
| 043 | 000010100101 | 1 | 000101010101 | 1 | 100010010000 | 3 |
| 044 | 000010100100 | 2 | 000101010010 | 2 | 001010010001 | 1 |
| 045 | 000100000001 | 1 | 000101010001 | 1 | 001010010100 | 2 |
| 046 | 000010001000 | 2 | 000100010010 | 2 | 001010100010 | 2 |
| 047 | 010100010000 | 3 | 001000100000 | 3 | 001010100101 | 1 |
| 048 | 000100101001 | 1 | 000100001001 | 1 | 001010100100 | 2 |
| 049 | 000010101010 | 2 | 000100010100 | 2 | 001010000001 | 1 |
| 050 | 000100000010 | 2 | 000100100010 | 2 | 001001000100 | 2 |
| 051 | 000100000101 | 1 | 000100100101 | 1 | 001001001000 | 2 |
| 052 | 010100100000 | 3 | 000100100100 | 2 | 001001000101 | 1 |
| 053 | 000101001001 | 1 | 000100101000 | 2 | 001010000010 | 2 |
| 054 | 000100000100 | 2 | 000101000101 | 1 | 001010100001 | 1 |
| 055 | 000100001000 | 2 | 000101000010 | 2 | 001010101000 | 2 |
| 056 | 000101010101 | 1 | 001000101001 | 1 | 100010100000 | 3 |
| 057 | 000100101010 | 2 | 000101010100 | 2 | 010000101001 | 1 |
| 058 | 000010010001 | 1 | 100001010000 | 3 | 010000000100 | 2 |
| 059 | 000010101000 | 2 | 001001001001 | 1 | 010000001000 | 2 |
| 060 | 000101010001 | 1 | 001000000010 | 2 | 010000000101 | 1 |

FIG. 15B

| Data Symbol | MCG1 Code Word MSB LSB | NCG | MCG2 Code Word MSB LSB | NCG | MCG3 Code Word MSB LSB | NCG |
|---|---|---|---|---|---|---|
| 061 | 000101001010 | 2 | 001000000100 | 2 | 100100010000 | 3 |
| 062 | 000101010010 | 2 | 001000000101 | 1 | 010001001001 | 1 |
| 063 | 001000000101 | 1 | 100010010000 | 3 | 010000101010 | 2 |
| 064 | 000101010100 | 2 | 001001010001 | 1 | 010001001010 | 2 |
| 065 | 000010100001 | 1 | 001000001000 | 2 | 010001010101 | 1 |
| 066 | 000100001010 | 2 | 001000101010 | 2 | 010001010010 | 2 |
| 067 | 000100100000 | 3 | 001001010101 | 1 | 001010101001 | 1 |
| 068 | 000100001001 | 1 | 001001001010 | 2 | 001010000100 | 2 |
| 069 | 000100010010 | 2 | 000100010001 | 1 | 010001010001 | 1 |
| 070 | 000100010100 | 2 | 000101000100 | 2 | 010001010100 | 2 |
| 071 | 000100010101 | 1 | 001010001001 | 1 | 010010001010 | 2 |
| 072 | 000100100010 | 2 | 001001010010 | 2 | 010010010101 | 1 |
| 073 | 000100100100 | 2 | 001001010100 | 2 | 010010010010 | 2 |
| 074 | 000100100101 | 1 | 001010010101 | 1 | 010000001001 | 1 |
| 075 | 000100101000 | 2 | 001010001010 | 2 | 001010001000 | 2 |
| 076 | 001000101001 | 1 | 000100100001 | 1 | 100000010000 | 3 |
| 077 | 001000000010 | 2 | 000101001000 | 2 | 010000010001 | 1 |
| 078 | 000101001000 | 2 | 010000010000 | 3 | 001010101010 | 2 |
| 079 | 001001001001 | 1 | 000101001001 | 1 | 010000001010 | 2 |
| 080 | 001000000100 | 2 | 001000001010 | 2 | 001010000101 | 1 |
| 081 | 001000001000 | 2 | 001000010010 | 2 | 010010001001 | 1 |
| 082 | 001001010101 | 1 | 001000010101 | 1 | 010010010100 | 2 |
| 083 | 001000001001 | 1 | 001010010001 | 1 | 010010100010 | 2 |
| 084 | 001001010001 | 1 | 001010010010 | 2 | 010010100101 | 1 |
| 085 | 001000101010 | 2 | 001010010100 | 2 | 010010100100 | 2 |
| 086 | 001001001010 | 2 | 001010100101 | 1 | 010000100001 | 1 |
| 087 | 001010010101 | 1 | 001010100010 | 2 | 010000010010 | 2 |
| 088 | 001001010010 | 2 | 001000001001 | 1 | 100000100000 | 3 |
| 089 | 000100010001 | 1 | 001000010100 | 2 | 010001000001 | 1 |
| 090 | 000101000010 | 2 | 010000100000 | 3 | 010000010100 | 2 |
| 091 | 001010001001 | 1 | 001000010001 | 1 | 010000100010 | 2 |
| 092 | 001001010100 | 2 | 001000100010 | 2 | 010000010101 | 1 |
| 093 | 001010001010 | 2 | 001000100100 | 2 | 100101010000 | 3 |
| 094 | 001010100101 | 1 | 001000100101 | 1 | 010010000001 | 1 |
| 095 | 001010010010 | 2 | 010101010000 | 3 | 010000100100 | 2 |
| 096 | 000100100001 | 1 | 001000100001 | 1 | 010000101000 | 2 |
| 097 | 000101000100 | 2 | 001000101000 | 2 | 010000100101 | 1 |
| 098 | 001000010000 | 3 | 001001000010 | 2 | 010001000010 | 2 |
| 099 | 000101000001 | 1 | 001001000101 | 1 | 010010010001 | 1 |
| 100 | 001000001010 | 2 | 001001000100 | 2 | 010010101000 | 2 |
| 101 | 001000010010 | 2 | 001010100001 | 1 | 010010100001 | 1 |
| 102 | 000101000101 | 1 | 001010100100 | 2 | 010100001010 | 2 |
| 103 | 001010010001 | 1 | 001001001000 | 2 | 010100010010 | 2 |
| 104 | 001010010100 | 2 | 001010000101 | 1 | 010100010101 | 1 |
| 105 | 001010100010 | 2 | 001010000010 | 2 | 010100010100 | 2 |
| 106 | 010000000101 | 1 | 010000101001 | 1 | 010010101001 | 1 |
| 107 | 001010100100 | 2 | 001010101000 | 2 | 010001000100 | 2 |
| 108 | 001000010001 | 1 | 100010100000 | 3 | 010010001001 | 1 |
| 109 | 001000010100 | 2 | 010001001001 | 1 | 010100000001 | 1 |
| 110 | 001000100000 | 3 | 010000000100 | 2 | 010001001000 | 2 |
| 111 | 001000100001 | 1 | 010000001000 | 2 | 010010000010 | 2 |
| 112 | 001000100010 | 2 | 010000000101 | 1 | 010001000101 | 1 |
| 113 | 001000100100 | 2 | 100100010000 | 3 | 010100010001 | 1 |
| 114 | 001000010101 | 1 | 010001010001 | 1 | 010100101001 | 1 |
| 115 | 010000010000 | 3 | 010000101010 | 2 | 010010000100 | 2 |
| 116 | 001001000001 | 1 | 010001001010 | 2 | 010010001000 | 2 |
| 117 | 001000101000 | 2 | 010001010101 | 1 | 010010000101 | 1 |
| 118 | 001001000010 | 2 | 010001010010 | 2 | 010010101010 | 2 |
| 119 | 001000100101 | 1 | 001001000001 | 1 | 010100100001 | 1 |
| 120 | 001001000100 | 2 | 001010000100 | 2 | 010100100010 | 2 |

FIG. 15C

| Data Symbol | MCG1 Code Word MSB LSB | NCG | MCG2 Code Word MSB LSB | NCG | MCG3 Code Word MSB LSB | NCG |
|---|---|---|---|---|---|---|
| 121 | 001010100001 | 1 | 010010001001 | 1 | 010101001001 | 1 |
| 122 | 001010101000 | 2 | 010001010100 | 2 | 010100000010 | 2 |
| 123 | 001001001000 | 2 | 010010001010 | 2 | 010100000100 | 2 |
| 124 | 001001000101 | 1 | 010010010101 | 1 | 010100000101 | 1 |
| 125 | 001010000010 | 2 | 010010010010 | 2 | 010100001000 | 2 |
| 126 | 010000101001 | 1 | 001010000001 | 1 | 010101000001 | 1 |
| 127 | 010000000100 | 2 | 001010001000 | 2 | 010100100100 | 2 |
| 128 | 001010000001 | 1 | 100000010000 | 3 | 100100100000 | 3 |
| 129 | 010001001001 | 1 | 001010101001 | 1 | 100000101001 | 1 |
| 130 | 010000001000 | 2 | 001010101010 | 2 | 010100101000 | 2 |
| 131 | 010000101010 | 2 | 010000001010 | 2 | 010101000010 | 2 |
| 132 | 010001010101 | 1 | 010000010101 | 1 | 010100100101 | 1 |
| 133 | 001010001000 | 2 | 010010010001 | 1 | 010101000100 | 2 |
| 134 | 010001010001 | 1 | 010010010100 | 2 | 100001001001 | 1 |
| 135 | 010001001010 | 2 | 010010100010 | 2 | 010101000100 | 2 |
| 136 | 010001010010 | 2 | 010010100101 | 1 | 010101010001 | 1 |
| 137 | 010010010101 | 1 | 010010100100 | 2 | 100001010001 | 1 |
| 138 | 010001010100 | 2 | 010000001001 | 1 | 010101001000 | 2 |
| 139 | 001010101001 | 1 | 010000010010 | 2 | 100000001000 | 2 |
| 140 | 001010000100 | 2 | 100000100000 | 3 | 010101000101 | 1 |
| 141 | 010010001001 | 1 | 010000010001 | 1 | 010101001010 | 2 |
| 142 | 010010001010 | 2 | 010000010100 | 2 | 100001001001 | 1 |
| 143 | 010010010010 | 2 | 010000100010 | 2 | 100000101010 | 2 |
| 144 | 010010100101 | 1 | 010000100101 | 1 | 100001001010 | 2 |
| 145 | 010010010100 | 2 | 010010101000 | 2 | 100001010101 | 1 |
| 146 | 010000001001 | 1 | 010000100001 | 1 | 100001010010 | 2 |
| 147 | 001010101010 | 2 | 010000100100 | 2 | 100000001001 | 1 |
| 148 | 010000100000 | 3 | 010000101000 | 2 | 010101010010 | 2 |
| 149 | 010000010001 | 1 | 010001000101 | 1 | 100010010001 | 1 |
| 150 | 010000001010 | 2 | 010001000010 | 2 | 100001010100 | 2 |
| 151 | 010000010010 | 2 | 010010100001 | 1 | 100010001010 | 2 |
| 152 | 001010000101 | 1 | 010100001010 | 2 | 100010010101 | 1 |
| 153 | 010010010001 | 1 | 010100001001 | 1 | 100010010010 | 2 |
| 154 | 010010100010 | 2 | 010100010010 | 2 | 100000010001 | 1 |
| 155 | 010010100100 | 2 | 010100010100 | 2 | 010101010100 | 2 |
| 156 | 010100010101 | 1 | 010100010101 | 1 | 100010010100 | 2 |
| 157 | 010010101000 | 2 | 010100100010 | 2 | 100000100001 | 1 |
| 158 | 010000100001 | 1 | 010001000001 | 1 | 100000001010 | 2 |
| 159 | 010000010100 | 2 | 010001000100 | 2 | 100000010010 | 2 |
| 160 | 010101010000 | 3 | 010100010001 | 1 | 010101010101 | 1 |
| 161 | 010001000001 | 1 | 010010000001 | 1 | 100010100001 | 1 |
| 162 | 010000100010 | 2 | 010001001000 | 2 | 100010100010 | 2 |
| 163 | 010000100100 | 2 | 010010000010 | 2 | 100010100100 | 2 |
| 164 | 010000010101 | 1 | 010010000101 | 1 | 100010100101 | 1 |
| 165 | 010100001001 | 1 | 010100100100 | 2 | 100010101000 | 2 |
| 166 | 010010000001 | 1 | 010010101001 | 1 | 100001000001 | 1 |
| 167 | 010000101000 | 2 | 010010000100 | 2 | 100000010100 | 2 |
| 168 | 010001000010 | 2 | 010010001000 | 2 | 100100001001 | 1 |
| 169 | 010000100101 | 1 | 010010000101 | 1 | 100010000001 | 1 |
| 170 | 010001000100 | 2 | 010010101010 | 2 | 100000100010 | 2 |
| 171 | 010010100001 | 1 | 010100100001 | 1 | 100000100100 | 2 |
| 172 | 010100001010 | 2 | 010100101000 | 2 | 100000010101 | 1 |
| 173 | 010100010001 | 1 | 010100000001 | 1 | 100100001010 | 2 |
| 174 | 010100010010 | 2 | 010100000010 | 2 | 100010101001 | 1 |
| 175 | 010100010100 | 2 | 010100000100 | 2 | 100000101000 | 2 |
| 176 | 010100100101 | 1 | 010101010101 | 1 | 100001000010 | 2 |
| 177 | 010100100010 | 2 | 010100001000 | 2 | 100000100101 | 1 |
| 178 | 010010101001 | 1 | 010101000001 | 1 | 100001000100 | 2 |
| 179 | 010001001000 | 2 | 010101000010 | 2 | 100100010001 | 1 |
| 180 | 010100100100 | 2 | 100100100000 | 3 | 100100010010 | 2 |

FIG. 15D

| Data Symbol | MCG1 Code Word MSB LSB | NCG | MCG2 Code Word MSB LSB | NCG | MCG3 Code Word MSB LSB | NCG |
|---|---|---|---|---|---|---|
| 181 | 010100000001 | 1 | 100000101001 | 1 | 100100100001 | 1 |
| 182 | 010010000010 | 2 | 010101000100 | 2 | 100100010100 | 2 |
| 183 | 010010000100 | 2 | 010101001000 | 2 | 100100100010 | 2 |
| 184 | 010001000101 | 1 | 010100100101 | 1 | 100100010101 | 1 |
| 185 | 010100101000 | 2 | 010100101010 | 2 | 100100100100 | 2 |
| 186 | 010100101001 | 1 | 100001001001 | 1 | 100100000001 | 1 |
| 187 | 010010001000 | 2 | 100000001000 | 2 | 100001001000 | 2 |
| 188 | 010010101010 | 2 | 010100101001 | 1 | 100100101000 | 2 |
| 189 | 010010000101 | 1 | 100001010001 | 1 | 100100101001 | 1 |
| 190 | 010100000010 | 2 | 100000101010 | 2 | 100010000010 | 2 |
| 191 | 010100100001 | 1 | 100001001010 | 2 | 100010000100 | 2 |
| 192 | 010101000010 | 2 | 010101000101 | 1 | 100001000101 | 1 |
| 193 | 010101001001 | 1 | 010101001001 | 1 | 100101001000 | 2 |
| 194 | 010100000100 | 2 | 100010001001 | 1 | 100101001001 | 1 |
| 195 | 010100001000 | 2 | 100001010010 | 2 | 100010001000 | 2 |
| 196 | 010100000101 | 1 | 100001010100 | 2 | 100010101010 | 2 |
| 197 | 010100101010 | 2 | 100001010101 | 1 | 100010000101 | 1 |
| 198 | 010101000001 | 1 | 100010001010 | 2 | 100100000010 | 2 |
| 199 | 010101000100 | 2 | 010101010001 | 1 | 100101000001 | 1 |
| 200 | 010101001010 | 2 | 010101001010 | 2 | 100101000010 | 2 |
| 201 | 010101010010 | 2 | 100010010001 | 1 | 100101010001 | 1 |
| 202 | 010101001000 | 2 | 100010010010 | 2 | 100100000100 | 2 |
| 203 | 010101010001 | 1 | 100010010100 | 2 | 100100001000 | 2 |
| 204 | 010101000101 | 1 | 100010010101 | 1 | 100100000101 | 1 |
| 205 | 101000001010 | 2 | 100010100010 | 2 | 100100101010 | 2 |
| 206 | 101000010010 | 2 | 100000001001 | 1 | 101000000010 | 2 |
| 207 | 101000010101 | 1 | 010101010010 | 2 | 100101000100 | 2 |
| 208 | 101000010100 | 2 | 100010101000 | 2 | 100101001010 | 2 |
| 209 | 101000101001 | 1 | 100000010001 | 1 | 100101010010 | 2 |
| 210 | 101000000010 | 2 | 010101010100 | 2 | 101000000100 | 2 |
| 211 | 101010100000 | 3 | 100000001010 | 2 | 101000000101 | 1 |
| 212 | 101001001001 | 1 | 100000010101 | 1 | 100100100101 | 1 |
| 213 | 101000000100 | 2 | 100010100001 | 1 | 101000001010 | 2 |
| 214 | 101000001000 | 2 | 100010100100 | 2 | 101000010010 | 2 |
| 215 | 101000000101 | 1 | 100100001010 | 2 | 101000010101 | 1 |
| 216 | 101000001001 | 1 | 100010100101 | 1 | 101000010100 | 2 |
| 217 | 101001010001 | 1 | 100100010010 | 2 | 101000101001 | 1 |
| 218 | 101000101010 | 2 | 100000100001 | 1 | 101000001000 | 2 |
| 219 | 101001001010 | 2 | 100000010010 | 2 | 101001010000 | 3 |
| 220 | 101001010101 | 1 | 100100001001 | 1 | 101001001001 | 1 |
| 221 | 101001010010 | 2 | 100001000001 | 1 | 101000101010 | 2 |
| 222 | 101000010001 | 1 | 100000010100 | 2 | 101001001010 | 2 |
| 223 | 101000100010 | 2 | 100000100010 | 2 | 101001010101 | 1 |
| 224 | 101010001001 | 1 | 100000100101 | 1 | 101010010000 | 3 |
| 225 | 101001010100 | 2 | 100100010100 | 2 | 101001010001 | 1 |
| 226 | 101010001010 | 2 | 100010000001 | 1 | 101001010010 | 2 |
| 227 | 101010010101 | 1 | 100000100100 | 2 | 101001010100 | 2 |
| 228 | 101010010010 | 2 | 100000101000 | 2 | 101010010101 | 1 |
| 229 | 101000100001 | 1 | 100001000101 | 1 | 101010001010 | 2 |
| 230 | 101000100100 | 2 | 100001000010 | 2 | 101000001001 | 1 |
| 231 | 101000010000 | 3 | 100100010001 | 1 | 101000100010 | 2 |
| 232 | 101001000001 | 1 | 100100100000 | 2 | 101010001001 | 1 |
| 233 | 101000101000 | 2 | 100100100001 | 1 | 101010010010 | 2 |
| 234 | 101001000010 | 2 | 100100100100 | 2 | 101010010100 | 2 |
| 235 | 101000100101 | 1 | 100100101000 | 2 | 101000010001 | 1 |
| 236 | 101010010001 | 1 | 100100010101 | 1 | 101000010000 | 3 |
| 237 | 101010010100 | 2 | 100101000010 | 2 | 101000100001 | 1 |
| 238 | 101010100010 | 2 | 100010101001 | 1 | 101000100100 | 2 |
| 239 | 101010100101 | 1 | 100001000100 | 2 | 101000100000 | 3 |
| 240 | 101010100100 | 2 | 100010000010 | 2 | 101001000001 | 1 |

FIG. 15E

| Data Symbol | MCG1 Code Word MSB        LSB | NCG | MCG2 Code Word MSB        LSB | NCG | MCG3 Code Word MSB        LSB | NCG |
|---|---|---|---|---|---|---|
| 241 | 101010000001 | 1 | 100100000001 | 1 | 101000101000 | 2 |
| 242 | 101001000100 | 2 | 100001001000 | 2 | 101001000010 | 2 |
| 243 | 101000100000 | 3 | 100010000100 | 2 | 101000100101 | 1 |
| 244 | 101010101001 | 1 | 100010000101 | 1 | 101010010001 | 1 |
| 245 | 101001001000 | 2 | 100100000010 | 2 | 101001000100 | 2 |
| 246 | 101010000010 | 2 | 100100101001 | 1 | 101001001000 | 2 |
| 247 | 101001000101 | 1 | 100101001000 | 2 | 101010001000 | 2 |
| 248 | 101010101000 | 2 | 100010101010 | 2 | 101010000001 | 1 |
| 249 | 101010000100 | 2 | 100100000101 | 1 | 100101010101 | 1 |
| 250 | 101010001000 | 2 | 100100000100 | 2 | 101010000010 | 2 |
| 251 | 101010101010 | 2 | 100101000001 | 1 | 101010000100 | 2 |
| 252 | 101010000101 | 1 | 100101000100 | 2 | 100101000101 | 1 |
| 253 | 010101010101 | 1 | 100100001000 | 2 | 100101010100 | 2 |
| 254 | 101010100001 | 1 | 100100101010 | 2 | 101001000101 | 1 |
| 255 | 010101010100 | 2 | 100100100101 | 1 | 101010000101 | 1 |

FIG. 16

| Data Symbol | ACG1 Code Word MSB  LSB | NCG | ACG2 Code Word MSB  LSB | NCG | ACG3 Code Word MSB  LSB | NCG |
|---|---|---|---|---|---|---|
| 000 | 000001000000 | 3 | 000000100000 | 3 | 000100000001 | 1 |
| 001 | 000010000000 | 3 | 000000100001 | 1 | 000100000010 | 2 |
| 002 | 000101000000 | 3 | 000000100010 | 2 | 000100000100 | 2 |
| 003 | 001001000000 | 3 | 000000100100 | 2 | 000100000101 | 1 |
| 004 | 001010000000 | 3 | 000000100101 | 1 | 000100001000 | 2 |
| 005 | 010001000000 | 3 | 000000101000 | 2 | 000100001001 | 1 |
| 006 | 010010000000 | 3 | 000000101001 | 1 | 000100001010 | 2 |
| 007 | 010101000000 | 3 | 000000101010 | 2 | 000100010000 | 3 |
| 008 | 101001000000 | 3 | 000001000000 | 3 | 000100010001 | 1 |
| 009 | 101010000000 | 3 | 000001000001 | 1 | 000100010010 | 2 |
| 010 | 000000010000 | 3 | 000001000010 | 2 | 000100010100 | 2 |
| 011 | 000000010001 | 1 | 000001000100 | 2 | 000100010101 | 1 |
| 012 | 000000010010 | 2 | 000001000101 | 1 | 000100100000 | 3 |
| 013 | 000000010100 | 2 | 000001001000 | 2 | 000100100001 | 1 |
| 014 | 000000010101 | 1 | 000001001001 | 1 | 000100100010 | 2 |
| 015 |  |  | 000001001010 | 2 | 000100100100 | 2 |
| 016 |  |  | 000001010000 | 3 | 000100100101 | 1 |
| 017 |  |  | 000001010001 | 1 | 000100101000 | 2 |
| 018 |  |  | 000001010010 | 2 | 000100101001 | 1 |
| 019 |  |  | 000001010100 | 2 | 000100101010 | 2 |
| 020 |  |  | 000001010101 | 1 | 000101000000 | 3 |
| 021 |  |  | 000010000000 | 3 | 000101000001 | 1 |
| 022 |  |  | 000101000000 | 3 | 000101000010 | 2 |
| 023 |  |  | 001001000000 | 3 | 000101000100 | 2 |
| 024 |  |  | 001010000000 | 3 | 000101000101 | 1 |
| 025 |  |  | 010001000000 | 3 | 000101001000 | 2 |
| 026 |  |  | 010010000000 | 3 | 000101001001 | 1 |
| 027 |  |  | 010101000000 | 3 | 000101001010 | 2 |
| 028 |  |  | 100001000000 | 3 | 000101010000 | 3 |
| 029 |  |  | 100010000000 | 3 | 000101010001 | 1 |
| 030 |  |  | 100101000000 | 3 | 000101010010 | 2 |
| 031 |  |  | 100101000101 | 1 | 000101010100 | 2 |
| 032 |  |  | 100101001000 | 2 | 000101010101 | 1 |
| 033 |  |  | 100101001001 | 1 | 001001000000 | 3 |
| 034 |  |  | 100101001010 | 2 | 001010000000 | 3 |
| 035 |  |  | 100101010000 | 3 | 010001000000 | 3 |
| 036 |  |  | 100101010001 | 1 | 010010000000 | 3 |
| 037 |  |  | 100101010010 | 2 | 010101000000 | 3 |
| 038 |  |  | 100101010100 | 2 | 100001000000 | 3 |
| 039 |  |  | 100101010101 | 1 | 100010000000 | 3 |
| 040 |  |  |  |  | 100101000000 | 3 |
| 041 |  |  |  |  | 101001000000 | 3 |
| 042 |  |  |  |  | 101010000000 | 3 |
| 043 |  |  |  |  | 101010100000 | 3 |
| 044 |  |  |  |  | 101010100001 | 1 |
| 045 |  |  |  |  | 101010100010 | 2 |
| 046 |  |  |  |  | 101010100100 | 2 |
| 047 |  |  |  |  | 101010100101 | 1 |
| 048 |  |  |  |  | 101010101000 | 2 |
| 049 |  |  |  |  | 101010101001 | 1 |
| 050 |  |  |  |  | 101010101010 | 2 |

|  | d | k | R(m/n) | R/C(d,k) |
|---|---|---|---|---|
| A-CODE | 1 | 7 | 0.6533 | 96.2% |
| B-CODE | 1 | 8 | 0.6531 | 95.3% |
| C-CODE | 1 | 7 | 0.6536 | 96.2% |
| CODE OF THE PRESENT INVENTION | 1 | 7 | 0.6650 | 97.9% |

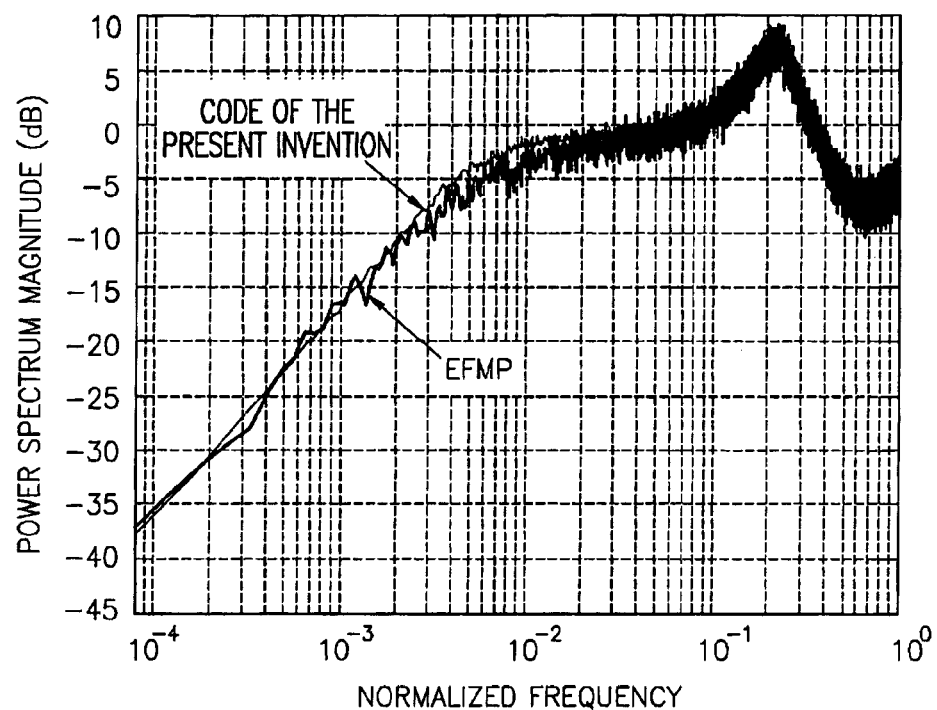

DATA MODULATING METHOD AND APPARATUS, DATA DEMODULATING METHOD AND APPARATUS, AND CODE ARRANGING METHOD

CROSS-REFERENCE TO RELATED APPLICATIONS

This application claims the priority of Korean Patent Application Nos. 2002-58809 and 2002-63534, filed on Sep. 27, 2002 and Oct. 17, 2002, respectively, in the Korean Intellectual Property Office, the disclosures of which are incorporated herein in their entireties by reference.

BACKGROUND OF THE INVENTION

1. Field of the Invention

The present invention relates to the field of data modulation and demodulation, and more particularly, to a data modulating method and apparatus, a data demodulating method and apparatus, and a code arranging method which provide modulation codes having a reduced error propagation probability, a high code efficiency, and a DC suppression capability.

2. Description of the Related Art

A multimode coding method provides a DC suppression capability to a modulation code having no DC suppression capability. In the multimode coding method, additional a-bit information is inserted into an input data stream, $2^a$ random data streams are generated depending on the additional a-bit information, and one of the modulated data streams containing the minimum DC component is selected even when modulation having no DC suppression capability is performed in the $2^a$ random data streams, so that the modulated data streams have a DC suppression capability.

U.S. Pat. No. 6,225,921 discloses "Device for Encoding/Decoding n-bit Source Words into Corresponding m-bit Channel Words, and vice versa" in which a code (d=1, k=7, m=2, and n=3) has a redundancy of about 2%, its code rate R is R=49/75=0.6533, and its code efficiency R/C (d, k) is R/C(d, k)=0.6533/0.6793=96.2%. For convenience, a modulation code used in U.S. Pat. No. 6,225,921 is called A-Code.

U.S. Pat. No. 6,281,815 discloses "Method of Allocating RLL code Having Enhanced DC Suppression Capability, Modulation Method, Demodulation Method, and Demodulation Apparatus therefor" in which when a code (d=1, k=8, m=8, and n=12) has a redundancy of about 2%, its code rate R is R=32/49=0.6531, and its code efficiency R/C (d, k) is R/C(d, k)=0.6531/0.6853=95.3%. For convenience, a modulation code used in U.S. Pat. No. 6,281,815 is referred to as B-Code. Here, "C" denotes capacity depending on "d" and "k".

In a guided scrambling method described in "Codes for Mass Data Storage Systems" by Kees A. Schouhamer Immink, Shannon Foundation Publishers, chapter 13, 1999, when redundant 4 bits are inserted into every 25 bytes of data and the data is RLL (1, 7)-modulated, a code rate R is R=200/306=0.6536, and a code efficiency R/C (d, k) is R/C(d,k)=0.6536/0.6793=96.2%. A modulation code used in the above document is referred to as a C-Code.

The code rates in the above-mentioned conventional modulation methods are similar, i.e., within a range of 95.3%–96.2%, and the power spectrum density (PSD) curves representing DC suppression capabilities of the A-Code, B-Code, and C-Code are shown in FIG. 1.

However, in the multimode coding method disclosed in the above document, the frequency of usage of additional information necessary for making a data stream into random data should be increased to have a sufficient DC suppression capability. Also, even though a modulation technology having higher code efficiency is developed, a DC suppression capability may be insufficient. For example, when the B-code disclosed in U.S. Pat. No. 6,281,815 does not contain redundant bits, it can suppress a DC, but cannot have a sufficient DC suppression capability in a case of having no additional bits. Hereinafter, a code, which is capable of suppressing a DC without redundant bits, but has a weak suppression performance in the absence of additional bits, is referred to as weak DC-free modulation code.

FIG. 2 illustrates a conventional multiplexing method of converting an input data stream into random data. The conventional multiplexing method by which an input data stream is converted into $2^a$ random data streams by continuously scrambling the input data stream using additional a-bit information is disclosed in Korean Pat. No. 1999-703183, entitled "Digital Modulation Circuit, Digital Modulation Method, Digital Demodulation Circuit, and Digital Demodulation Method", filed by SANYO DENKI CO., LTD.

In FIG. 2, an input data stream $\underline{y}_t$ composed of data $x_{i,0}$ through $x_{i,u-1}$ (referred to as code modulation units) of predetermined bits is converted into a random data stream $f(\underline{y}_t/s_t)$ by performing exclusive OR operations on multiplexed information $s_t$ and the code modulation units $x_{i,0}$ through $x_{i,u-1}$ using exclusive OR devices.

In other words, the first code modulation unit $x_{i,0}$ is converted into data $y^t_{i,0}$ by performing an exclusive OR operation on the first code modulation unit $x_{i,0}$ and the initial data (multiplexed information) $s_t$ using an exclusive OR device. A next code modulation unit $x_{i,1}$ is converted into data $y^t_{i,1}$ by performing an exclusive OR operation on the converted data $y^t_{i,0}$ and the code modulation unit $x_{i,1}$. Thereafter, an exclusive OR operation is repeated on converted data of a preceding code modulation unit and a code modulation unit to be converted up to the final code modulation unit $x_{i,u-1}$ of the data input stream $\underline{y}_t$ to create converted data of each code modulation unit.

FIG. 3 illustrates a stream $\underline{y}'_t$ that is demodulated through an inversion of an RLL stream $f'(\underline{y}_t/s_t)$ when an input data stream is converted into random data according to the multiplexing method presented in FIG. 2, Run Length Limited (RLL)-modulated, and recorded on and reproduced from a storage medium.

During the inversion of data, the demodulated stream $\underline{y}'_t$ is generated by performing an exclusive OR operation, in a repeated fashion, on each demodulation code unit to be inverted except a first demodulation code unit (multiplexed information $s_t$) of a non-inverted RLL stream $f'(\underline{y}_t/s_t)$ and a demodulation code unit (initial data or a non-inverted demodulation code unit) immediately before the demodulation code unit to be inverted.

In other words, the first demodulation code unit $y'_{i,0}$ is inverted into data $x_{i,0}$ by performing an exclusive OR operation on the first demodulation code unit $y'_{i,0}$ and the initial data (multiplexed information) $s_t$. Next, a demodulation code unit $y'_{i,1}$ is inverted into data $x_{i,1}$ by performing an exclusive OR operation on the first non-inverted demodulation code unit $y'_{i,0}$ and the demodulation code unit $y'_{i,1}$. Thereafter, an exclusive OR operation is repeated on a demodulation code unit to be inverted and a demodulation code unit immediately before the demodulation code unit to be inverted up to the final demodulation code unit of the RLL stream $f'(\underline{y}_t/s_t)$ to generate inverted data of each demodulation code unit.

As described above, during the inversion of data, one non-inverted demodulation code unit is used in the inversion of a demodulation code unit. Thus, when an error occurs in the demodulation code unit to be inverted, the error also affects a subsequent demodulation code unit. For example, when a non-inverted demodulation code unit $y'^*_{i,u-3}$ has an error, the error affects inverted data $x^*_{i,u-3}$ and subsequent data $x^*_{i,u-2}$.

Accordingly, in the prior art, when the RLL stream $f'(\underline{y}_i/s_t)$ has an error, the error propagates to unscrambled data $x^*_{i,u-3}$ and subsequent data $x^*_{i,u-2}$. The error propagation is a general feature of the multimode coding method using scrambling.

SUMMARY OF THE INVENTION

The present invention provides a data modulating method and apparatus that provides a highly efficient modulation code having a higher DC suppression capability by maintaining a DC suppression performance as described in the above-mentioned three references and applying a multimode coding method to a weak DC-free modulation code.

The present invention also provides a data modulating method and apparatus and a data demodulating method and apparatus to reduce an error propagation possibility.

The present invention also provides a data modulating method and apparatus and a data demodulating method and apparatus adopting a multiplexing method of generating pseudo random data streams by maintaining a DC suppression performance and discontinuously scrambling input data.

The present invention also provides a method of arranging a weak DC-free modulation code by generating code words satisfying a (d, k) constraint, and then arranging the code words so that the original characteristic of a code stream is maintained even when the code words are arranged according to boundary rules during arrangement of the code stream.

According to an aspect of the present invention, a data modulating method modulates m-bit source data into n-bit ($n \geq m$) code words where a minimum run length limit is confined to "d" and a maximum run length limit is confined to "k". An input data stream is divided by a predetermined length, and the input data stream is multiplexed using multiplexed information according to a predetermined multiplexing method to provide a multiplexed data stream. The multiplexed data stream is weak DC-free run length limited (RLL)-modulated without a separate DC control code conversion table including additional bits, and then a code stream having a minimum of DC components among multiplexed, RLL-modulated code streams is provided.

According to another aspect of the present invention, a data modulating method modulates m-bit source data into n-bit ($n \geq m$) code words where a minimum run length limit is confined to "d" and a maximum run length limit is confined to "k". An input data stream divided by a predetermined length is multiplexed into a plurality of types of pseudo random data streams using multiplexed information of predetermined bits by applying a predetermined multiplexing method to each of the pseudo random data streams. The plurality of types of pseudo random data streams is RLL-modulated to create a modulated code stream in which an optimal DC suppression is performed.

According to still another aspect of the present invention, a data modulating method modulates m-bit source data into n-bit ($n \geq m$) code words where a minimum run length limit is confined to "d" and a maximum run length limit is confined to "k". An input data stream divided by a predetermined length is multiplexed into a plurality of types of pseudo random data streams using multiplexed information of predetermined bits by applying a predetermined multiplexing method to each of the pseudo random data streams. The multiplexed data streams are weak DC-free RLL-modulated without using a DC control code conversion table including additional bits, and a code stream including a minimum of DC components among multiplexed, RLL-modulated code streams is provided.

According to yet another aspect of the present invention, a data demodulating method demodulates each n bit of input digital data into m-bit ($n \geq m$) of a demodulation code unit to generate a non-inverted data stream having a predetermined length. The non-inverted data stream is inconsecutively descrambled using multiplexed information to generate an inverted data stream.

According to yet another aspect of the present invention, a method of arranging m-bit source data into n-bit ($n \geq m$) code words confines a minimum run length limit "d" to 1 and a maximum run length limit "k" to 7. When a code word a is connected to a code word b, the code word a is a preceding code word, the code word b is selected from code words b1 and b2, a code stream in which the code word a is connected to the code word b1 is X1, and a code stream in which the code word a is connected to the code word b2 is X2, the code words b1 and b2 are arranged to have opposite parameters INV predicting a transition of a next code depending on whether a number of bits of value "1" in a code word is odd or even. When the code word a is connected to the code word b1 or b2, although the code word a, b1, or b2 is modulated into another type of code word according to a boundary rule, the code streams X1 and X2 are arranged to have opposite parameters INV.

According to yet another aspect of the present invention, an apparatus modulates m-bit source data into n-bit ($n \geq m$) code words to improve a DC suppression capability by confining a minimum run length limit to "d" and a maximum run length limit to "k". The apparatus includes a multiplexer that multiplexes input data divided by a predetermined length using multiplexed information to provide a multiplexed data stream, an encoder that weak DC-free RLL-modulates the multiplexed data stream without using a DC control sub code conversion table to which additional bits are added, and a selector that selects a code stream comprising a minimum of DC components among multiplexed, RLL-modulated code streams.

According to yet another aspect of the present invention, a data modulating apparatus modulates m-bit source data into n-bit ($n \geq m$) code words where a minimum run length limit is confined to "d" and a maximum run length limit is confined to "k". The data modulating apparatus includes a multiplexer that multiplexes an input data stream divided by a predetermined length into a plurality of types of pseudo random data streams using multiplexed information of predetermined bits by applying a predetermined multiplexing method to each of the pseudo random data streams, and an encoder that RLL-modulates the plurality of types of pseudo random data streams to create a modulated code stream in which the best DC suppression is performed.

According to yet another aspect of the present invention, a data modulating apparatus modulates m-bit source data into n-bit ($n \geq m$) code words where a minimum run length limit is confined to "d" and a maximum run length limit is confined to "k". The data modulating apparatus includes a multiplexer that multiplexes an input data stream divided by a predetermined length into a plurality of types of pseudo random data streams using multiplexed information of predetermined bits by applying a predetermined multiplexing method to each of the pseudo random data streams, an encoder that weak DC-free RLL-modulates the multiplexed data stream without using DC control sub code conversion table to which additional bits are added, and a selector that selects a code stream comprising a minimum of DC components among multiplexed, RLL-modulated code streams.

According to yet another aspect of the present invention, a data demodulating apparatus includes a decoder that demodulates each n bit of input digital data into m-bit ($n \geq m$) of a demodulation code unit to generate a non-inverted data stream having a predetermined length, and a demultiplexer that inconsecutively descrambles the non-inverted data stream using multiplexed information to generate an inverted data stream.

The operations of the method of the present invention may be implemented by computer-executable instructions of a computer-readable medium.

Additional aspects and advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 8 shows code word characteristics of main code groups;

FIG. 9 shows code word characteristics of auxiliary code groups for DC control;

FIGS. 15A through 15E show a main code conversion table created and arranged in consideration of the above-described conditions;

FIG. 16 shows a sub code conversion table for DC control created and arranged in consideration of the above-described conditions;

FIG. 19 illustrates a PSD curve of an RLL (2, 10) code according to an aspect of an embodiment of the present invention; and FIG. 20 shows recording density and recording efficiency of the RLL (2, 10) code and recording density and recording efficiency of an existing eight-to-fourteen modulation plus (EFMP) code.

DETAILED DESCRIPTION OF THE PREFERRED EMBODIMENTS

Figure 1:
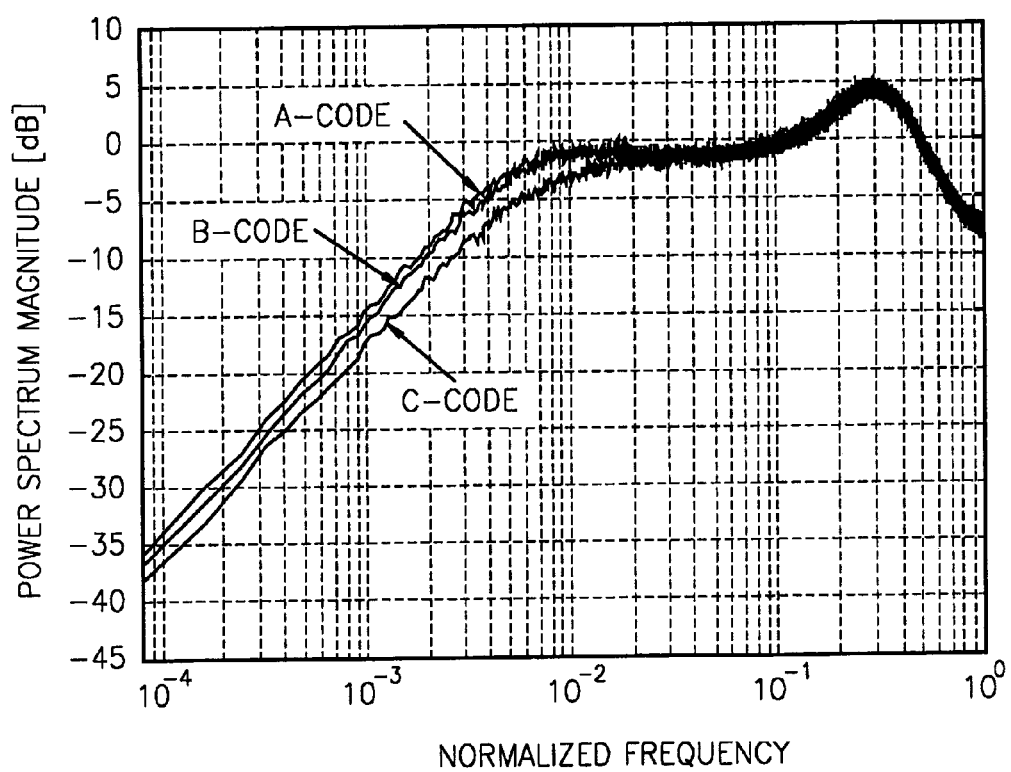
FIG. 1 illustrates power spectrum density (PSD) curves of conventional codes.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 4:
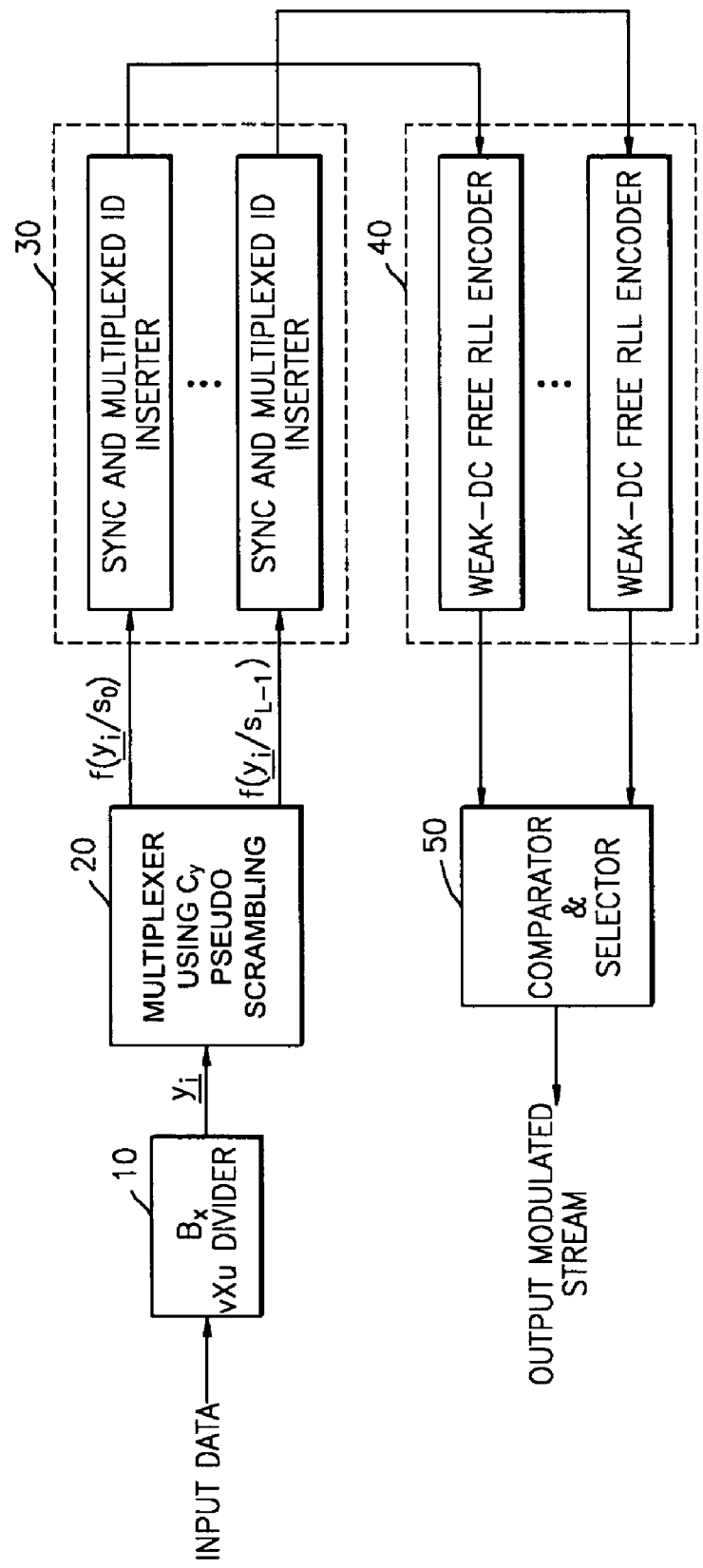
FIG. 4 is a block diagram of a data modulating apparatus according to an aspect of an embodiment of the present invention.

FIG. 4 is a block diagram of a data modulating apparatus according to an embodiment of the present invention. Referring to FIG. 4, an input data stream may be expressed as in Equation 1 and divided by a vXu slicer 10 as in Equation 2. In other words, the input data stream is divided into vXu(=k) data streams, i.e., v data streams each having a u byte length.

$$x = (x_0, x_1, \ldots, x_{k-1}, \ldots, x_{l-1}) \qquad (1)$$

$$B_x = \begin{bmatrix} x_{0,0}, x_{0,1}, \ldots, x_{0,u-1} \\ x_{1,0}, x_{1,1}, \ldots, x_{1,u-1} \\ \ldots \\ x_{i,0}, x_{i,1}, \ldots, x_{i,j}, \ldots, x_{i,u-1} \\ x_{v-1,0}, x_{v-1,1}, \ldots, x_{v-1,u-1} \end{bmatrix} = \begin{bmatrix} y_0 \\ y_1 \\ \ldots \\ y_i \\ \ldots \\ y_{v-1} \end{bmatrix} \qquad (2)$$

wherein $x_{i,j} = x_{ixu+j}$.

A multiplexer 20 using pseudo scrambling multiplexes each vXu data stream divided by the vXu slicer 10 into $L=2^a$ data streams by adding a-bit information to each vXu data stream, and then converts the $L=2^a$ data streams into pseudo random data depending on added multiplexed information s. A data stream $\underline{y_+}$ having a u byte length is multiplexed into $2^a$ u-byte data containing different contents as in Equations 3 and 4.

$$\underline{C_y} = (\underline{C_0}, \underline{C_1}, \ldots, \underline{C_i}, \ldots, \underline{C_{y-1}}) \qquad (3)$$

$$C_i = \begin{bmatrix} s_0, y_{i,0}^0, x_{i,1}, \ldots, x_{i,q-1}, y_{i,q}^0, x_{i,q+1}, \ldots, y_{i,p*q}^0, \ldots, x_{i,u-1} \\ s_1, y_{i,0}^1, x_{i,1}, \ldots, x_{i,q-1}, y_{i,q}^1, x_{i,q+1}, \ldots, y_{i,p*q}^1, \ldots, x_{i,u-1} \\ s_{L-1}, y_{i,0}^{L-1}, x_{i,1}, \ldots, x_{i,q-1}, y_{i,q}^{L-1}, x_{i,q+1}, \ldots, y_{i,p*q}^{L-1}, \ldots, x_{i,u-1} \end{bmatrix} \qquad (4)$$

$$= \begin{bmatrix} f(\underline{y}_i/s_0) \\ f(\underline{y}_i/s_1) \\ f(\underline{y}_i/s_{L-1}) \end{bmatrix}$$

wherein u−1 is a multiple of q, p=0, 1, . . . , r, r is a share of (u−1)/q, and q is referred to as a scramble interval exponent. A function $f(\underline{y}_i/s)$ refers to the result of the conversion of the input data stream $\underline{y}_i$ into random data using the multiplexed information s.

A sync signal and multiplexed ID inserter 30 may have a plurality of channels (here, $L=2^a$) depending on a number of bits of the added multiplexed information s. The sync signal and multiplexed ID inserter 30 inserts a sync pattern into the $2^a$ multiplexed pseudo random data streams, i.e., the multiplexed pseudo random data stream to which the multiplexed information s is added, and then converts the multiplexed information s into multiplexed IDs.

A weak DC-free RLL encoder 40 may have a plurality of channels (here, $L=2^a$) depending on the added multiplexed information, and RLL-modulates a weak DC-free modulation code. Here, according to RLL modulation, m-bit source data is converted into an n-bit code word (n≧m) which is limited to a minimum run length "d" constraint and a maximum run length "k" constraint.

The weak DC-free RLL encoder 40 encodes a code which is capable of suppressing a DC when redundancy does not exist in the absence of an additional DC suppression code conversion table containing additional bits but has a weak DC suppression capability into a code word that satisfies a predetermined RLL condition. That is, an RLL (1, 7, 8, 12) code wherein a minimum run length d=1 and a maximum run length k=7, groups the code word into code words according to the above RLL condition, and RLL-modulates the code words using a main code conversion table in which code words are arranged so that a code word stream of a source word has a DC control capability and a sub code conversion table for DC control that satisfies the predetermined RLL condition and is made by taking unnecessary code words out of the main code conversion table.

The sync signal and multiplexed ID inserter 30 may convert the multiplexed information into the multiplexed IDs by confining the minimum run length "d" to 2 and the maximum run length "k" to 7 to increase the size of a minimum mark or pit, thereby reducing interferential noise of a signal. As another aspect, the weak DC-free RLL encoder 40 may encode a code, e.g., a RLL (2, 10, 8, 15) code, where the minimum run length "d" is 2 and the maximum run length "k" is 10.

A comparator and selector 50 selects an RLL modulated stream having a smallest number of DC components among the $2^a$ RLL modulated streams.

Figure 5:
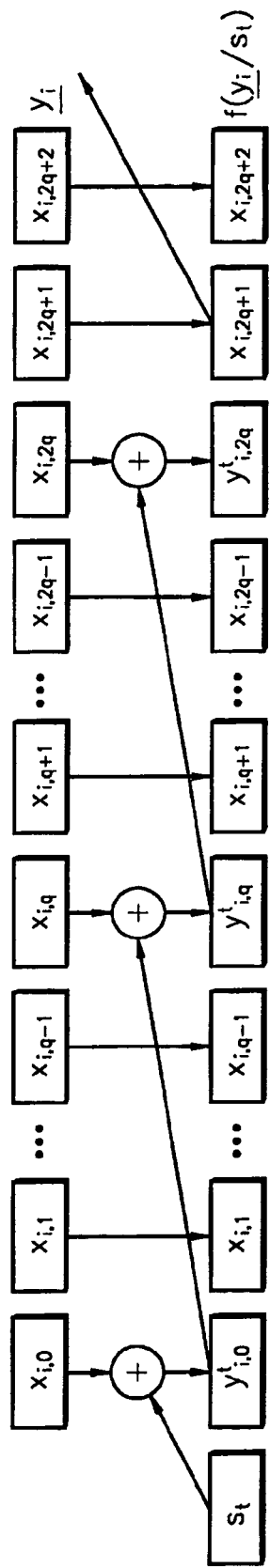
FIG. 5 illustrates a multiplexing method using pseudo scrambling applied to a multiplexer of FIG. 4.

FIG. 5 illustrates a multiplexing method using pseudo scrambling applied to the multiplexer 20 shown in FIG. 4. The present invention refers to a method of inconsecutively scrambling input data as the multiplexing method using pseudo scrambling.

Figure 2:
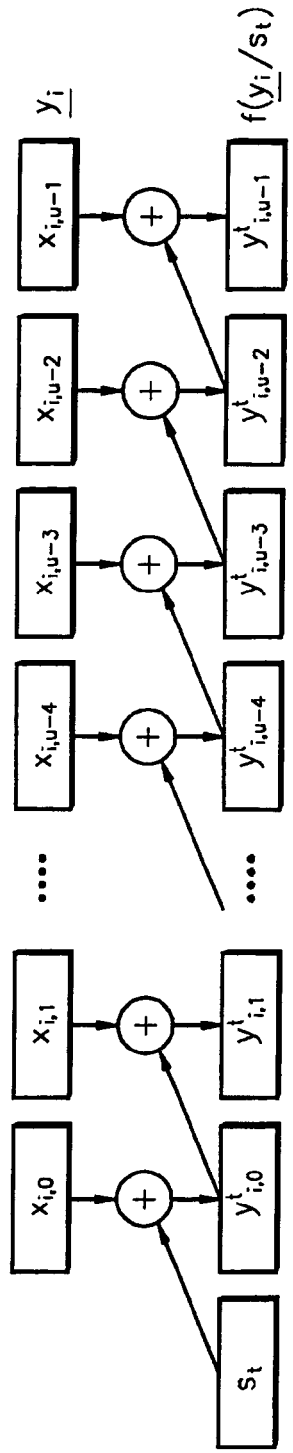
FIG. 2 illustrates a conventional multiplexing method.
Figure 3:
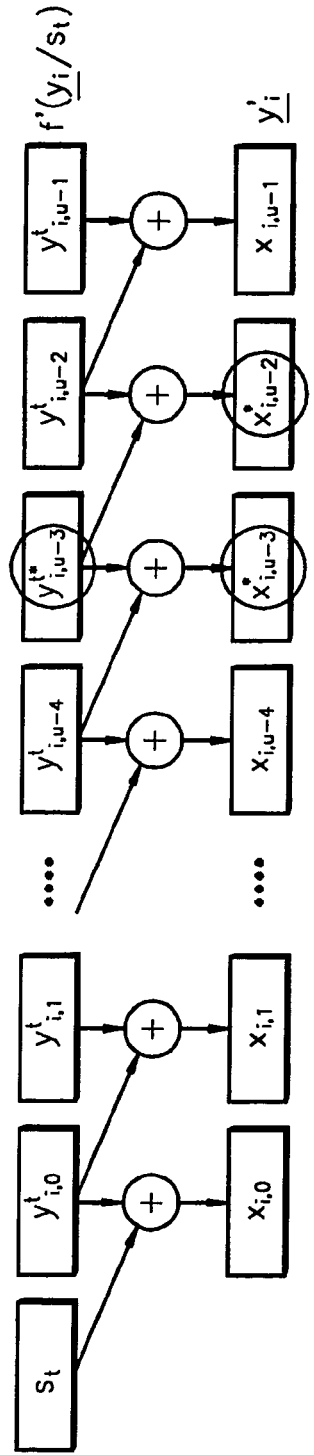
FIG. 3 illustrates an error propagation characteristic when data converted using the conventional multiplexing method presented in FIG. 2 is reproduced.

In the multiplexing method using pseudo scrambling, as shown in FIG. 2, if an error occurs in a data position, the error causes an error in the next data. Accordingly, if data is inconsecutively scrambled without affecting DC components of a code stream, the probability of error propagation to the next data may be reduced.

In FIG. 5, an input data stream $\underline{y}_t$ of u byte length, which includes $x_{i,0}$ through $x_{i,u-1}$, each of which has predetermined data bits, is converted into pseudo random data $f(\underline{y}_t/s_t)$ by performing an exclusive OR operation on multiplexed information $s_t$ and inconsecutive $q_{th}$ ones of $x_{i,0}$ through $x_{i,u-1}$ using inconsecutive $q_{th}$ exclusive OR devices.

When a number a of bits of the multiplexed information $s_t$ is less than or equal to a number m of bits of input data, all of the bits of the multiplexed information $s_t$ are used to multiplex the input data stream $\underline{y}_t$ having the u byte length. However, if a<m, the conversion of a bits of least significant bits (LSBs) of the input data, a bits of most significant bits (MSBs) of the input data, or a bits of m bits of the input data into pseudo random data displays has almost the same efficiency as the conversion of all of m bits into pseudo random data.

In other words, a first code modulation unit (first data to be modulated) $x_{i,0}$ is modulated into data $y^t_{i,0}$ by performing an exclusive OR operation on the first code modulation unit $x_{i,0}$ and the initial data (multiplexed information) $s_t$. Exclusive OR operations are not performed on code modulation units $x_{i,1}$ through $x_{i,q-1}$, and thus the code modulation units $x_{i,1}$ through $x_{i,q-1}$ are output unchanged. Thereafter, an exclusive OR operation is performed on the modulated data $y^t_{i,0}$ and a code modulation unit $x_{i,q}$ of inconsecutive $q^{th}$ modulation units to create next modulated data $y^t_{i,q}$. An exclusive OR operation is repeated to a final one of the inconsecutive $q^{th}$ modulation units of the input data stream $\underline{y}_t$.

Figure 6:
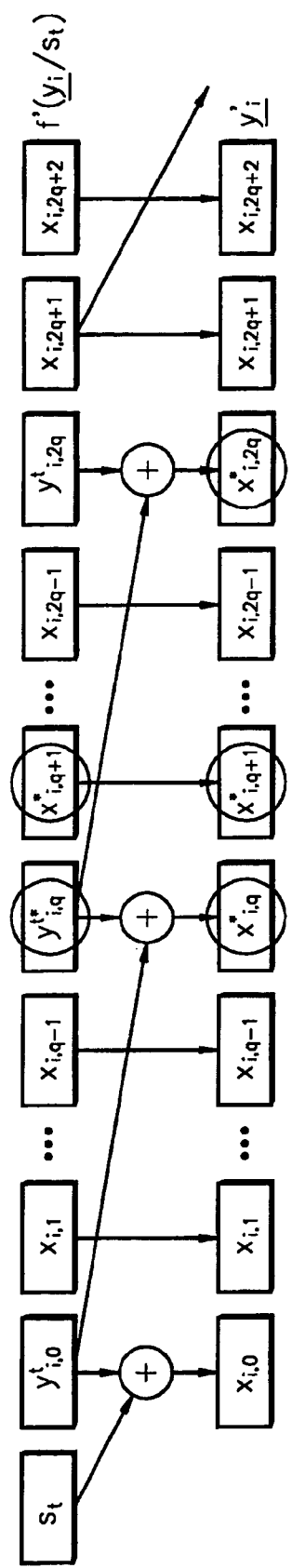
FIG. 6 illustrates an error propagation characteristic when data converted using the multiplexing method presented in FIG. 5 is reproduced.

FIG. 6 illustrates an error propagation characteristic when reproducing pseudo random data modulated according to the multiplexing method using pseudo scrambling presented in FIG. 5. During inversion of data, a data stream $f'(\underline{y}_t/s_t)$ is an RLL stream that is demodulated by a decoder (not shown) that demodulates the data stream in accordance with the RLL modulating method used during modulation. Also, the structure shown in FIG. 6 may be called a demultiplexer which inconsecutively descrambles non-inverted data using multiplexed information to provide an inverted data stream.

In FIG. 6, an exclusive OR operation is performed on initial data (multiplexed data $s_t$) and a first demodulation code unit $y^t_{i,0}$ and then on each of inconsecutive $q^{th}$ demodulation code units to be inverted and each demodulation code unit prior to each $q^{th}$ demodulation code unit to create restored data.

In other words, an exclusive OR operation is performed on the first demodulation code unit $y^t_{i,0}$ and the initial data (multiplexed data $s_t$) to create inverted data $x_{i,0}$. Exclusive OR operations are not performed on demodulation code units $x_{i,1}$ through $x_{i,q-1}$, and the demodulation code units $x_{i,1}$ through $x_{i,q-1}$ are output unchanged. Thereafter, an exclusive OR operation is performed on the first demodulation code unit $y^t_{i,0}$ (which is not inverted) and a first $q^{th}$ demodulation code unit $y^t_{i,q}$ of the inconsecutive $q^{th}$ demodulation code units to create inverted data $X_{i,q}$. Next, an exclusive OR operation is repeated to a final one of the inconsecutive $q^{th}$ demodulation code units of the non-inverted data stream $f'(\underline{y}_t/s_t)$.

Accordingly, pseudo random data is RLL-modulated, stored on a storage medium such as an optical disc, and reproduced as an RLL stream $f'(\underline{y}_t/s_t)$ from the storage medium. If an error then appears only in data $x^*_{i,q+1}$ of the RLL stream $f'(\underline{y}_t/s_t)$ that is not converted into another type of data by an exclusive OR operation, the error does not propagate into another data. Error propagation occurs only when an error is generated in a reproduced RLL stream corresponding to input data that is modulated into another type of data through an exclusive OR operation.

When data is converted into pseudo random data according to the multiplexing method using pseudo scrambling presented in FIG. 5, an error propagation probability is reduced to 1/q (q is a cycle of an exclusive OR operation), compared to the multiplexing method presented in FIG. 2. Here, a value of q should be determined to accept a DC capability after RLL modulation. The error propagation probability as well as the DC suppression capability may decrease with an increase in the value of q. In contrast, the error propagation probability as well as the DC suppression capability may increase with a reduction in the value of q.

Figure 7:
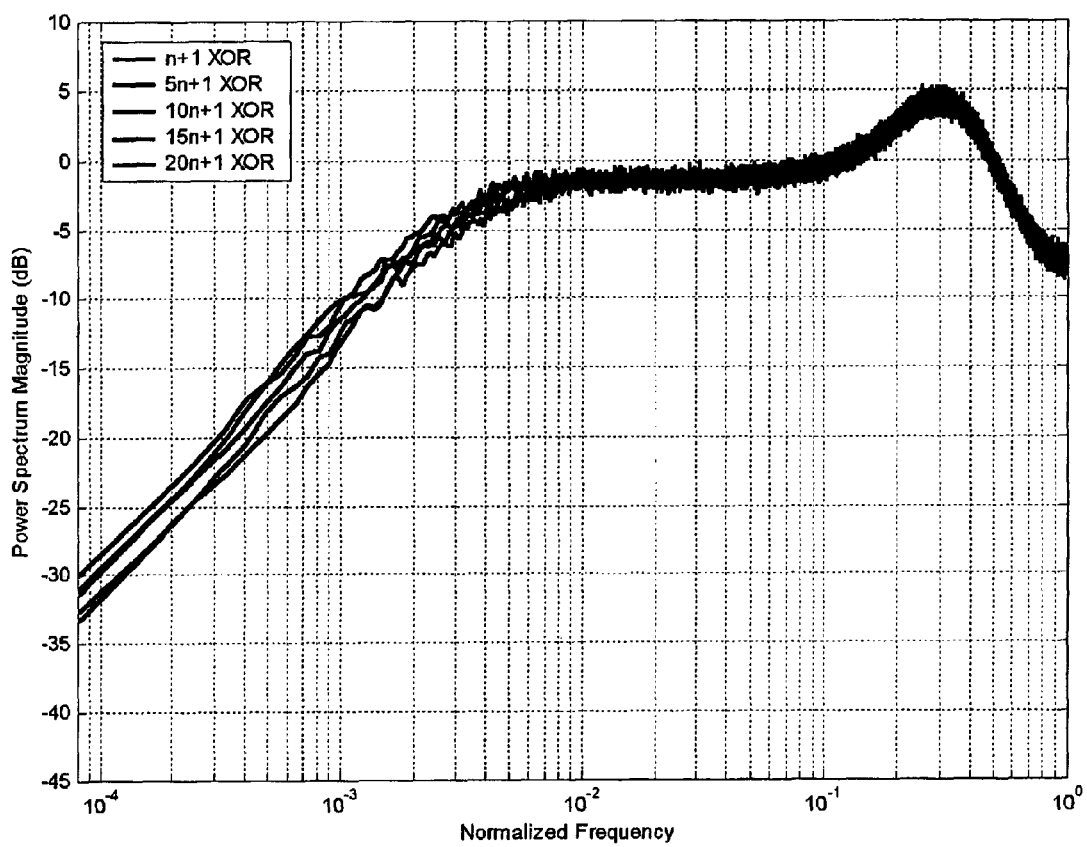
FIG. 7 illustrates PSD curves showing DC suppression capabilities in a data modulating method according to an aspect of an embodiment of the present invention.

FIG. 7 depicts PSD curves showing changes in the DC suppression capability depending on the exclusive OR operation cycle q. A DC suppression capability of a modulated code stream depending on the exclusive OR operation cycle q is shown, wherein a number a of bits of multiplexed information $s_t$ is 2, a multiplex length u is 50, and a number m of bits of input data to be modulated is 8. An exclusive OR operation is performed on 2 bits of the multiplexed information $s_t$ and 2 bits of LSBs of 8-bit input data. The PSD curves show the DC suppression capability varying depending on the results of the exclusive OR operation when the exclusive OR operation cycle q is 1 byte, 5 bytes, 10 bytes, 15 bytes, and 20 bytes. As may be seen in FIG. 7, although the exclusive OR operation is performed every 5 byte, the DC suppression capability hardly varies, while an error propagation rate may be reduced to ⅕.

A weak DC-free RLL modulation code according to an embodiment of the present invention will now be explained.

An RLL (d, k, m, n) code is appraised according to recording density and DC suppression capability. Here, m denotes a number of data bits (also referred to as a number of bits of source data or a number of bits of an information word), n denotes a number of bits of a modulated code word (also called a number of channel bits), d denotes the minimum number (the minimum run length limit) of successive zeros which may exist between the "1" bits in a code word, and k denotes the maximum number (the maximum run length limit) of successive zeros which may exist between the "1" bits in a code word. A bit gap in a code word is indicated by T corresponding to a cycle of clock signal used in recording or reproduction.

In a modulating method, recording density may be improved by reducing the number n, but by not varying the minimum run length limit d and the number m. However, the RLL code should satisfy the minimum run length limit d and the maximum run length limit k in the code word. Thus, a number of code words satisfying the RLL (d, k) condition are $2^m$ (m is a number of data bits) or more. However, in order to actually use the RLL code, a portion connecting a code word to a code word should also satisfy the RLL (d, k) condition and a code to be used should have a DC suppression capability when DC components of the code affect the performance of an optical recording and/or reproducing apparatus.

In an embodiment of the present invention, two types of code tables, i.e., a main code conversion table and a sub code conversion table for DC control, are generated for code words of a source code to be modulated.

A method of creating code words in the main code conversion table and the sub code conversion table will be described below, taking an RLL (1, 7) code, where the minimum run length limit is 1 and the maximum run length limit is 7, as an example.

FIG. 8 illustrates a plurality of code word groups of the main conversion and the code word characteristics of the code word groups.

When the minimum run length limit is d, the maximum run length limit is k, a number of bits of source data is m, a number of bits of a modulated code word is n, a number of successive zeros from LSBs of the modulated code word to MSBs are end zeros (EZ), and a number of successive zeros from MSBs to LSBs are lead zeros (LZ), code words in which d=1, k=7, m=8, n=12, and $0 \leq EZ \leq 5$ are classified below according to LZ conditions.

(1) The number of code words satisfying $1 \leq LZ \leq 7$ is 210.
(2) The number of code words satisfying $0 \leq LZ \leq 4$ is 316.
(3) The number of code words satisfying $0 \leq LZ \leq 2$ is 264.

In order to modulate 8-bit source data, the number of code words should be at least 256 or more. However, in the group (1), the number of code words is less than 256, and thus a portion of code words satisfying a different LZ condition are taken to supplement a shortage of code words. In other words, 51 "1010xxxxxxxx" code words are subtracted from code words satisfying LZ=0 in the group (2) and then added to the code words in the group (1). Then, the number of code words in the group (1) becomes 261, the number of code words in the group (2) becomes 265, and the number of code words in the group (3) is 264. As a result, each of the groups (1), (2), and (3) contains 256 or more code words, and thus may satisfy the minimum number "256" of code words of 8-bit source data to be modulated. 256 code words are taken out of each of the groups (1), (2), and (3) to make three main code groups MCG1, MCG2, and MCG3. In FIG. 8, the main code group MCG1 corresponds to the group (1) containing the code words satisfying $1 \leq LZ \leq 7$ and 51 code words taken out of the group (2), and the main code groups MCG2 and MCG3 correspond to the groups (2) and (3), respectively. Only 256 code words of each of the main code groups MCG1, MCG2, and MCG3 are used as code words of source data to be modulated.

FIG. 9 illustrates a plurality of code word groups of a sub code conversion table for DC control and the code word characteristics of the code word groups.

Code words in the sub code conversion table are code words (wherein d=1, k=7, m=8, and n=12) satisfying $6 \leq EZ \leq 7$, redundant code words of the main code groups MCG1, MCG2, and MCG3, and code words satisfying $5 \leq LZ \leq 6$ or LZ=3, and then used as auxiliary code groups. Conditions of creating the code words of the sub code conversion table will be described below in detail and the auxiliary code groups are indicated by ACG1, ACG2, and ACG3.

The auxiliary code group ACG1 contains 15 code words which are made from: 8 code words satisfying $6 \leq EZ \leq 7$ and LZ≠0+5 redundant code words of the main code group MCG1+2 "1010xxxxxxxx" code words satisfying $6 \leq EZ \leq 7$ and LZ=0.

The auxiliary code group ACG2 contains 40 code words which are made from: 12 code words satisfying $6 \leq EZ \leq 7$ and $0 \leq LZ \leq 6$+21 code words satisfying $0 \leq EZ \leq 5$ and $5 \leq LZ \leq 6$+9 redundant code words of the main code group MCG2-2 "1010xxxxxxxx" code words satisfying $6 \leq EZ \leq 7$ and LZ=0.

The auxiliary code group ACG3 contains 51 code words which are made from: 10 code words satisfying $6 \leq EZ \leq 7$ and $0 \leq LZ \leq 3$+33 code words satisfying $0 \leq EZ \leq 5$ and LZ=3+8 redundant code words of the main code group MCG3.

Figures 10, 11, 12:
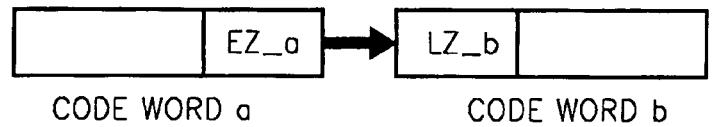
FIG. 10 shows a next code group ncg determined depending on a number of end zeros EZ.
FIG. 11 illustrates a run length limited (RLL) condition when a code word a is connected to a code word b.
FIG. 12 shows changes in a parameter INV before and after code conversion when the RLL condition of FIG. 11 is not satisfied.

FIG. 10 shows a parameter ncg indicating a next code group M=ncgdet determined depending on a number EZ_a of end zeros of preceding code words a in the main code conversion table described with reference to FIG. 8 and the sub code conversion table for DC control described with reference to FIG. 9, i.e., a next code group of the previous code words a. A code group to which a code word b belongs is determined depending on the number EZ_a. In other words, if the number EZ_a is "0", the code group of the code word b is "1" (=MCG1), if $1 \leq EZ\_a \leq 3$, 2 (=MCG2), and if $4 \leq EZ\_a \leq 7$, 3 (=MCG3).

A portion connecting the code words a to the code word b has to satisfy the RLL (d, k) condition.

FIG. 11 illustrates the RLL (d, k) condition when a code word a is connected to a code word b. A value obtained by adding a number of EZ_a of end zeros of the code word a to a number of LZ_b of lead zeros of the code word b should be greater than or equal to the minimum run length d and less than or equal to the maximum run length k in order to meet the RLL (d, k) condition.

FIG. 12 illustrates changes in a parameter INV before and after code modulation when the code words a and b does not comply with the RLL (d, k) condition described with reference to FIG. 11. The parameter INV indicates the transition of a next code word, where if a number of bits of value "1" in a code word is even, the parameter INV is "0", while if a number of bits of value "1" in the code word is odd, the parameter INV is "1". In addition, a digital sum value (DSV) parameter refers to a DSV in a code word stream and a low absolute DSV indicates that the code word stream contains a small number of DC or low frequency components. A code word sum value (CSV) parameter represents a DC value in a code word and is used to measure DC or low frequency components during modulation of codes, and a low CSV indicates that the code word contains a small number of DC or low frequency components. If an INV value cumulated to a current code word in the code word stream is "0", a CSV value of a next code word is added to a DSV value cumulated to a code word prior to the next code word to update the DSV value. If the cumulated INV value is "1", the sign of the CSV of the next code word is inverted and then added to the cumulated DSV value to update the DSV value.

Referring to FIG. 12, a code group to which a code word b belongs is determined depending on a number EZ_a of end zeros of a preceding code word a. In a case where a code group that takes code words out of another code conversion table due to lack of code words in the main code conversion table and the sub code conversion table for DC control is designated as the code group of the code word b, the code group of the code word b may not satisfy the RLL (d, k) condition. In FIG. 12, the code group of the code word b violates $d \leq EZ\_a+LZ\_b \leq k$, where the number EZ_a of end zeros of the code word a is changed. A change in a code word due to the incompliance with a RLL condition is called a "boundary rule". The parameter INV indicating whether the number of bits of value "1" in the code word stream is even or odd is likely to vary from a state prior to code modulation according to the boundary rule. Thus, code words are arranged in a predetermined order in code conversion tables for DC control.

Figures 13, 14:
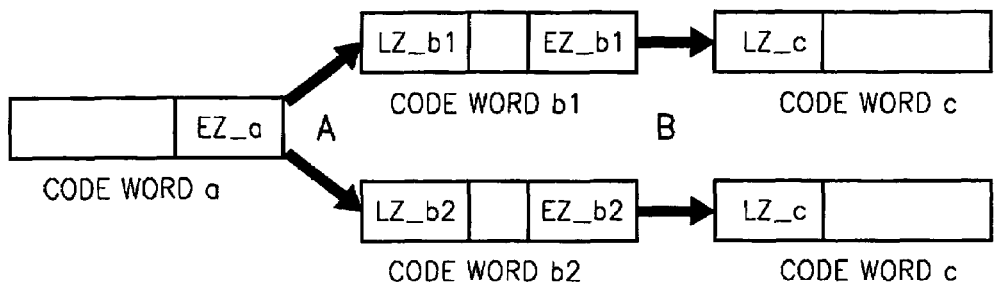
FIG. 13 illustrates an example of the divergence of a code stream due to code words b1 and b2 for DC control.
FIG. 14 shows multiplexed information converted into multiplexed IDs in a sync signal and multiplexed ID inserter shown in FIG. 4.

FIG. 13 illustrates the divergence of a code word stream due to code words b1 and b2 for DC control. The remarkable feature of code modulation according to an embodiment of the present invention is that code words in two selectable code conversion tables have opposite INV characteristics (which indicate whether the number of bits of value "1" in a code word stream is even or odd) in order to control a direct current (DC). Thus, since the code words in the two selectable code conversion tables have opposite INV characteristics, one of the two code words may be arranged for an optimum DC control. As described previously according to the boundary rule, the parameter INV may be changed. However, this change is not significant when the same phenomenon occurs in two code conversion tables that may be selected at a point of DC control, i.e., the parameter INV is changed in both the code conversion tables. Accordingly, in an embodiment of the present invention, code conversion tables are designed in consideration of the following conditions.

First, in position A in which a code word a is connected to a code word b, code words b1 and b2 may be selected as the code word b. In this case, a number of EZ_a of end zeros of the code word a are the same as in "xxxxxxxxx101", a number LZ_b1 of lead zeros of the code word b1 are the same as in "101xxxxxxxxx", and a number of LZ_b2 of lead zeros of the code word b2 are the same as in "101xxxxxxxx". In other words, code words having a number of lead zeros as in "101xxxxxxxxx" are disposed in the same position in the main code group MCG1 and the auxiliary code group ACG1, all of code words having a number of end zeros as in "xxxxxxxxx101" are disposed in the same position in the main code group MCG1 and the auxiliary code group ACG1, in the main code group MCG2 and the auxiliary code group ACG2, and in the main code group MCG3 and the auxiliary code group ACG3. Accordingly, when a number of end zeros of the code word a are the same as in "xxxxxxxxx101", the parameter INV of the code word a is changed or not changed. Thus, a code stream to which the code word b1 belongs and a code stream to which the code word b2 belongs have opposite INV characteristics according to the boundary rule.

Next, when the code words b1 and b2 are connected to code words c, respectively, in position B in which the code word b is connected to a code word c, although the code word b1, b2, or c is modulated into another type of code word according to the boundary rule, a code stream in which the code word b1 is connected to the code word c and a code stream in which the code word b2 is connected to the code word c have opposite parameters INV.

A sync pattern and multiplexed IDs will now be explained.

In a modulating method in which the maximum number "k" of successive zeros existing between the "1" bits is limited to 7, a sync pattern "010000000010000000010" violating the limitation of k=7 will be used.

Sync Pattern: 010000000010000000010

As shown in FIG. 14, 4-bit multiplexed information is modulated into a 6-bit multiplexed ID to multiplex a data stream. In this case, one data stream is converted into $L=2^4=16$ types of random data streams.

FIGS. 15A through 15E illustrate a main code conversion table created and arranged in consideration of the above-described conditions.

FIG. 16 shows a sub code conversion table for DC control created and arranged in consideration of the above-described conditions. Whether a preceding code word (codeword a of FIG. 13) and a following code word (codeword c of FIG. 13) violate a run length limit is checked. When the preceding code word and the following code word do not violate the run length limit, code words in the sub code conversion table should be used.

Figures 17, 18:
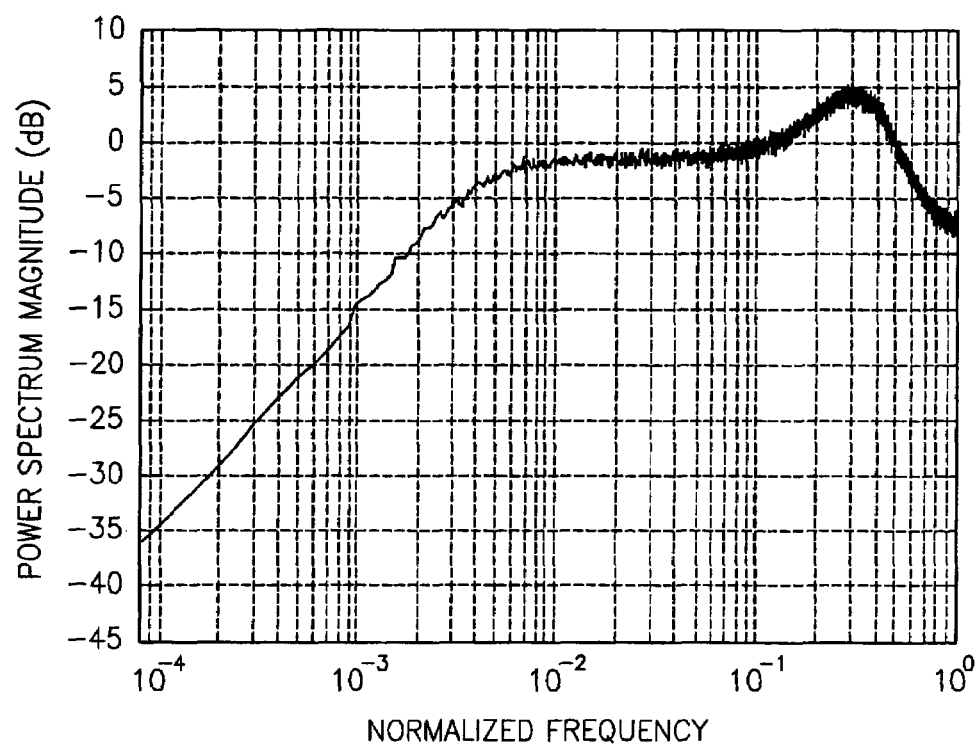
FIG. 17 illustrates a PSD curve of a RLL (1, 7) code according to an aspect of an embodiment of the present invention.
FIG. 18 shows recording density and recording efficiency of the RLL (1, 7) code according to an embodiment of the present invention and recording densities and recording efficiencies of A-Code, B-Code, and C-Code.

FIG. 17 illustrates a PSD curve of a code stream that is RLL (1, 7)-modulated according to the present invention.

FIG. 18 compares a code rate and a code efficiency of the RLL (1, 7) code according to an embodiment of the present invention with code rates and code efficiencies of the conventional A-Code, B-Code, and C-Code. The RLL (1, 7) code has a similar DC suppression capability to, and a higher code efficiency than, the conventional A-Code, B-Code, and C-Code. As a result, recording density may increase by about 2%.

FIG. 19 illustrates PSD curves showing a DC suppression capability of an RLL (2, 10, 8, 15) code according to an embodiment of the present invention and a DC suppression capability of an eight-to-fourteen modulation plus (EFMP) code used on a conventional DVD. Here, the EFMP code suppresses a DC using a separate code conversion table for DC control in addition to a main code conversion table. An example of the RLL (2, 10, 8, 15) code is disclosed in Korean Patent Application No. 2001-21360 filed by the present applicant. An embodiment of the present invention performs a weak DC-free RLL modulation which uses a main code conversion table and a sub code conversion table for DC control instead of the separate sub code conversion table containing additional bits.

FIG. 20 compares a code rate and a code efficiency of the RLL (2, 10, 8, 15) code according to an embodiment of the present invention with a code rate and a code efficiency of the EFMP code. The RLL (2, 10, 8, 15) code has a DC suppression capability similar to and a higher code efficiency than, the EFMP code, which results in increasing recording density by about 5.4%.

The embodiment of the present invention may be effectively applied to a wide variety of storage media storing digital data, particularly high-density storage media such as high density digital versatile discs (HD-DVDs).

As described above, the present invention can combine a weak DC-free modulation code with a multimode coding method to provide a high-efficient modulation code having an improved DC suppression capability. As a result, recording density may be improved.

Moreover, when code words violating an RLL condition are replaced with another type of code words during DC suppression RLL modulation, the replaced code words may be arranged to maintain a DC suppression capability of a code stream. As a result, an improvement effect of the DC suppression capability of the code stream may be achieved.

Furthermore, in the multimode coding method, input data is discontinuously scrambled to be multiplexed into pseudo random data to remove DC components. Thus, the DC suppression capability may be retained and an error propagation probability may be reduced compared to a multimode coding method using a general scrambling method.

The operations of the method of the present invention may be implemented by computer-executable instructions of a computer-readable medium.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A data modulating method of modulating m-bit source data into n-bit, wherein n≧m, and m and n are positive integers, code words where a minimum run length limit is confined to "d" and a maximum run length limit is confined to "k", wherein "d" and "k" are positive integers, the data modulating method comprising:
multiplexing an input data stream divided by a predetermined length into a plurality of types of pseudo random data streams using multiplexed information of predetermined bits by applying a predetermined multiplexing method to each of the pseudo random data streams; and
RLL-modulating the plurality of types of pseudo random data streams to create a modulated code stream in which an optimal DC suppression is performed.

2. The data modulating method of claim 1, wherein the random data streams are generated by inconsecutively scrambling the input data stream using the multiplexed information.

3. The data modulating method of claim 2, wherein when $s_t$ is multiplexed information used to multiplex the input data stream divided into v data streams each having a u-byte length, a number a of bits of the multiplexed information $s_t$ is less than or equal to a number m of bits of input source data, wherein u and v are positive integers.

4. The data modulating method of claim 3, wherein the generation of random data streams comprises:
performing an exclusive OR operation on the multiplexed information $s_t$ and first m-bit data of a first code modulation unit of the plurality of types of random data streams to generate modulated data;
outputting data unchanged from a second code modulation unit to a $q-1^{th}$ code modulation unit without performing an exclusive OR operation;
performing an exclusive OR operation on the first code modulation unit and a $q^{th}$ code modulation unit to generate next modulated data; and
repeating an exclusive OR operation from the $q^{th}$ code modulation unit to a final code modulation unit of the input data stream.

5. The data modulating method of claim 4, wherein when an exclusive OR operation cycle is q, where q is a positive integer, an error propagation probability is reduced to 1/q.

6. The data modulating method of claim 1, further comprising:
dividing the input data stream into the predetermined length;
inserting a sync pattern into the multiplexed pseudo random data streams to which the multiplexed information is added in the generation of the random data streams and converting the multiplexed information into multiplexed IDs; and
comparing the plurality of types of RLL-modulated code streams to select the code stream comprising the minimum of DC components.

7. A data modulating method of modulating m-bit source data into n-bit, wherein n≧m, and m and n are positive integers, code words where a minimum run length limit is confined to "d" and a maximum run length limit is confined to "k", wherein "d" and "k" are positive integers, the data modulating method comprising:
multiplexing an input data stream divided by a predetermined length into a plurality of types of pseudo random data streams using multiplexed information of predetermined bits by applying a predetermined multiplexing method to each of the pseudo random data streams; and
weak DC-free RLL-modulating the multiplexed data streams without using a DC control code conversion table comprising additional bits and providing a code stream comprising a minimum of DC components among multiplexed, RLL-modulated code streams.

8. The data modulating method of claim 7, wherein the pseudo random data streams are generated by inconsecutively scrambling the input data stream using the multiplexed information.

9. The data modulating method of claim 8, wherein $s_t$ is multiplexed information used to multiplex the input data stream divided into v data streams each having a u-byte length, a number a of bits of the multiplexed information $s_t$ is less than or equal to a number m of bits of input source data, wherein u and v are integers.

10. The data modulating method of claim 9, wherein the generation of the pseudo random data streams comprises:
performing an exclusive OR operation on the multiplexed information $s_t$ and first m-bit data of a first code modulation unit of the plurality of types of pseudo random data streams to generate modulated data;
outputting data unchanged from a second code modulation unit to a $q-1^{th}$ code modulation unit without performing an exclusive OR operation;
performing an exclusive OR operation on the first code modulation unit and a $q^{th}$ code modulation unit to generate next modulated data; and
repeating an exclusive OR operation from the $q^{th}$ code modulation unit to a final code modulation unit of the input data stream.

11. The data modulating method of claim 10, wherein when an exclusive OR operation cycle is q, where q is a positive integer, an error propagation probability is reduced to 1/q.

12. The data modulating method of claim 7, wherein the weak DC-free RLL modulation is performed by generating code words complying with a predetermined RLL condition and grouping the code words according to the predetermined RLL condition using a main code conversion table in which code words are arranged so that a stream of source words has a DC control capability and using a DC control sub code conversion table which is made by taking unnecessary code words complying with the predetermined RLL condition out of the main code conversion table.

13. The data modulating method of claim 12, wherein the main code conversion table comprises code word groups that satisfy conditions of $0 \leq EZ \leq 5$, $1 \leq LZ \leq 7$, $0 \leq LZ \leq 4$, and $0 \leq LZ \leq 2$, wherein EZ is end zeros indicating a number of successive zeros from least significant bits to most significant bits in a code word and LZ is lead zeros indicating a number of successive zeros from most significant bits to least significant bits.

14. The data modulating method of claim 13, wherein one of the code groups of the main code conversion table comprising source codes less than a minimum number of code words to be modulated is prepared by removing redundant code words from one of the code groups comprising code words greater than the minimum number so that code words greater than the minimum number are retained.

15. The data modulating method of claim 12, wherein the DC control sub conversion table comprises:
a group comprising code words satisfying $6 \leq EZ \leq 7$ and $LZ \neq 0$, redundant code words of a first main code group, and "1010xxxxxxxx" code words satisfying $6 \leq EZ \leq 7$ and LZ=0;
a group comprising code words satisfying $6 \leq EZ \leq 7$ and $0 \leq LZ \leq 6$, code words satisfying $0 \leq EZ \leq 5$ and $5 \leq LZ \leq 6$, and redundant code words of a second main code group, the group from which "1010xxxxxxxx" code words satisfying $6 \leq EZ \leq 7$, LZ=0 are removed, wherein EZ is end zeros indicating a number of successive zeros from most significant bits to least significant bits and LZ is lead zeros indicating a number of successive zeros from most significant bits to least significant bits; and
a group comprising code words complying with $6 \leq EZ \leq 7$ and $0 \leq LZ \leq 3$, code words satisfying $0 \leq EZ \leq 5$ and LZ=3, and redundant code words of a third main code group.

16. The data modulating method of claim 15, wherein when a stream of code words a, b1, and c, and a stream of code words a, b2, and c make a pair and the code words b1 and the b2 are code words having opposite INV characteristics in the DC control sub code conversion table, although the code word a, b1, b2, or c is converted due to a violation against a predetermined run length limit/boundary rule between the stream of the code words a, b1, and b2 and the stream of the code words b1, b2, and c, code words are arranged in the main code conversion table and the DC control sub code conversion table so that a modulated stream of code words a, b1, and c and a modulated stream of code words a, b2, and c have opposite INV characteristics.

17. The data modulating method of claim 12, wherein the minimum run length limit "d" is 1 and the maximum run length limit "k" is 7.

18. The data modulating method of claim 12, wherein in the weak DC-free RLL modulation, code words of same data in main code groups and in DC control auxiliary code groups, have opposite INV values to control a DC, and INV is a parameter predicting a transition direction of a next code word depending on whether a number of bits of value "1" in a code word stream is odd or even.

19. The data modulating method of claim 12, wherein the minimum run length limit "d" is 2 and the maximum run length limit "k" is 10.

20. The data modulating method of claim 7, further comprising:
dividing the input data stream into the predetermined length;
inserting a sync pattern into the multiplexed pseudo random data streams to which the multiplexed information is added in generation of the random data streams and converting the multiplexed information into multiplexed IDs; and
comparing the plurality of types of RLL-modulated code streams to select the code stream comprising the minimum of DC components.

21. The data modulating method of claim 20, wherein the multiplexed IDs satisfy the minimum run length limit "d" of 2 and the maximum run length limit "k" of 7 to increase a minimum mark length to reduce interferential noise of a signal.

22. A computer-readable medium having computer-executable instructions for performing operations of a data modulating method of modulating m-bit source data into n-bit, wherein $n \geq m$ and m and n are positive integers, code words where a minimum run length limit is confined to "d" and a maximum run length limit is confined to "k", wherein "d" and "k" are positive integers, the operations comprising:
multiplexing an input data stream divided by a predetermined length into a plurality of types of pseudo random data streams using multiplexed information of predetermined bits by applying a predetermined multiplexing method to each of the pseudo random data streams; and
RLL-modulating the plurality of types of pseudo random data streams to create a modulated code stream in which an optimal DC suppression is performed.

23. A computer-readable medium having computer-executable instructions for performing operations of a data modulating method of modulating m-bit source data into n-bit, wherein n≧m and m and n are positive integers, code words where a minimum run length limit is confined to "d" and a maximum run length limit is confined to "k", wherein "d" and "k" are positive integers, the operations comprising:

multiplexing an input data stream divided by a predetermined length into a plurality of types of pseudo random data streams using multiplexed information of predetermined bits by applying a predetermined multiplexing method to each of the pseudo random data streams; and weak DC-free RLL-modulating the multiplexed data streams without using a DC control code conversion table comprising additional bits and providing a code stream comprising a minimum of DC components among multiplexed, RLL-modulated code streams.

* * * * *